United States Patent
Lee et al.

(10) Patent No.: US 11,675,464 B2
(45) Date of Patent: Jun. 13, 2023

(54) TOUCH INPUT SENSING APPARATUS FOR HOUSING OF ELECTRIC DEVICE

(71) Applicant: Samsung Electro-Mechanics Co., Ltd., Suwon-si (KR)

(72) Inventors: Jong Woo Lee, Suwon-si (KR); Ho Kwon Yoon, Suwon-si (KR); Yong Woon Ji, Suwon-si (KR); Dong Hun Han, Suwon-si (KR); Woo Young Choi, Suwon-si (KR); Joo Yul Ko, Suwon-si (KR); Je Hyuk Ryu, Suwon-si (KR); Byung Joo Hong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 437 days.

(21) Appl. No.: 16/808,872

(22) Filed: Mar. 4, 2020

(65) Prior Publication Data
US 2020/0379603 A1  Dec. 3, 2020

(30) Foreign Application Priority Data

May 31, 2019 (KR) .................. 10-2019-0064765
Aug. 29, 2019 (KR) .................. 10-2019-0106882

(51) Int. Cl.
*G06F 3/044* (2006.01)
*G06F 3/041* (2006.01)
*G06F 1/16* (2006.01)

(52) U.S. Cl.
CPC .......... *G06F 3/0445* (2019.05); *G06F 1/1613* (2013.01); *G06F 3/0416* (2013.01); *G06F 2203/04107* (2013.01)

(58) Field of Classification Search
CPC .................. G06F 3/0445; G06F 3/0416; G06F 2203/04107
See application file for complete search history.

(56) References Cited

U.S. PATENT DOCUMENTS

| | | | |
|---|---|---|---|
| 2009/0219039 A1* | 9/2009 | Fasshauer | H03K 17/955 324/683 |
| 2013/0155630 A1* | 6/2013 | Yilmaz | G06F 3/0443 361/748 |

(Continued)

FOREIGN PATENT DOCUMENTS

| | | |
|---|---|---|
| JP | 5651036 B2 | 1/2015 |
| JP | 2015-28712 A | 2/2015 |

(Continued)

*Primary Examiner* — Liliana Cerullo
(74) *Attorney, Agent, or Firm* — NSIP Law

(57) ABSTRACT

A touch input sensing device configured to be added to an electronic device, the electronic device including a touch input unit, the touch input unit including a first touch member integrated with a housing. The touch input sensing device includes a resonant circuit configured to generate a resonance signal having a resonant frequency that varies based on a touch of the touch input unit, a digital frequency counter configured to count a reference frequency signal based on the resonance signal, or count the resonance signal based on the reference frequency signal, to generate a count value, and a touch detector configured to detect whether the touch of the touch input unit has occurred based on the count value generated by the digital frequency counter, and output a touch detection signal indicating whether the touch has occurred.

33 Claims, 24 Drawing Sheets

(56) References Cited

U.S. PATENT DOCUMENTS

| | | |
|---|---|---|
| 2015/0035793 A1 | 2/2015 | Hirotsune et al. |
| 2015/0130649 A1 | 5/2015 | Itakura et al. |
| 2018/0093695 A1 | 4/2018 | Hattori et al. |
| 2018/0120364 A1 | 5/2018 | Lee et al. |
| 2019/0073077 A1 | 3/2019 | Kim et al. |
| 2019/0348990 A1* | 11/2019 | Lee ........................ H03M 1/004 |
| 2020/0371659 A1* | 11/2020 | Kim ........................ G06F 3/044 |
| 2021/0103351 A1* | 4/2021 | Aso ................... G02F 1/133308 |

FOREIGN PATENT DOCUMENTS

| | | |
|---|---|---|
| JP | 2015-95865 A | 5/2015 |
| KR | 2002-0077836 A | 10/2002 |
| KR | 10-2009-0120709 A | 11/2009 |
| KR | 10-2018-0046833 A | 5/2018 |
| KR | 10-2019-0027553 A | 3/2019 |

\* cited by examiner

TOUCH INPUT SENSING APPARATUS FOR HOUSING OF ELECTRIC DEVICE

CROSS-REFERENCE TO RELATED APPLICATIONS

This application claims the benefit under 35 USC 119(a) of Korean Patent Application Nos. 10-2019-0064765 filed on May 31, 2019, and 10-2019-0106882 filed on Aug. 29, 2019, in the Korean Intellectual Property Office, the entire disclosures of which are incorporated herein by reference for all purposes.

BACKGROUND

1. Field

This application relates to a touch input sensing apparatus for a housing of an electric device.

2. Description of Related Art

In general, it is desirable that a wearable device be thin and have a simple and clean design is desirable. To achieve this, existing mechanical switches in wearable devices have been replaced with non-mechanical switches implemented using dustproof and waterproof technologies, enabling the production of wearable devices having seamless housing.

For the purpose of implementing and developing non-mechanical switches, current technologies such as touch-on-metal (ToM) technology in which a metal surface is touched, a capacitance sensing method using a touch panel, a microelectromechanical system (MEMS), a micro strain gauge, and other technologies have been developed. In addition, even a force touch function that can determine how hard a button has been pushed is under development.

In the case of an existing mechanical switch, a large size and an internal space are required to implement a switching function, and a design may be somewhat untidy and a large space may be required due to an outwardly protruding shape of the switch, the structure of the switch not being integrated with an external case, and other problems.

In addition, there is a risk of an electric shock due to direct contact with an electrically connected mechanical switch. Moreover, a structure of the mechanical switch makes it difficult to implement dustproofing and waterproofing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a touch input sensing device is configured to be added to an electronic device; the electronic device includes a touch input unit; the touch input unit includes a first touch member integrated with a housing; and the touch input sensing device includes a resonant circuit configured to generate a resonance signal having a resonant frequency that varies based on a touch of the touch input unit; a digital frequency counter configured to count a reference frequency signal based on the resonance signal, or count the resonance signal based on the reference frequency signal, to generate a count value; and a touch detector configured to detect whether the touch of the touch input unit has occurred based on the count value generated by the digital frequency counter, and generate a touch detection signal indicating whether the touch has occurred.

The resonant circuit may include an inductance circuit having an inductance and including a first coil element disposed on an inner surface of the first touch member, or spaced apart from the inner surface of the first touch member; and a capacitance circuit having a capacitance and including a capacitance element connected to the inductance circuit, wherein the capacitance circuit may be configured so that the capacitance of the capacitance circuit increases based on the touch of the touch input unit.

The first coil element may be mounted on a substrate and may be disposed on the inner surface of the first touch member.

The first coil element may be mounted on a substrate and may be spaced apart from the inner surface of the first touch member.

The digital frequency counter may be further configured to divide the reference frequency signal by a reference frequency division ratio to generate a divided reference clock signal, and count the resonance signal based on the divided reference clock signal to generate the count value.

The digital frequency counter may be further configured to divide the reference frequency signal by a reference frequency division ratio to generate a divided reference clock signal, divide the resonance signal by a sensing frequency division ratio to generate a divided resonance signal, and count the divided resonance signal based on the divided reference clock signal to generate the count value.

The digital frequency counter may include a frequency down-converter configured to receive the reference frequency signal as a reference clock signal, and divide the reference clock signal by a reference frequency division ratio to generate a divided reference clock signal; a periodic timer configured to receive the resonance signal as a sample clock signal, receive the divided reference clock signal, and count the sample clock signal during one time period of the divided reference clock signal to generate a periodic count value; and a cascaded integrator-comb (CIC) filter circuit configured to receive the periodic count value, and cumulatively amplify the periodic count value to generate the count value.

The CIC filter circuit may include a decimator CIC filter configured to receive the periodic count value, and cumulatively amplify the periodic count value to generate a cumulatively amplified periodic count value; and a first-order CIC filter configured to receive the cumulatively amplified periodic count value, and calculate a moving average of the cumulatively amplified periodic count value to remove noise from the cumulatively amplified periodic count value and generate the count value.

The decimator CIC filter may be further configured to cumulatively amplify the periodic count value by a cumulative gain determined based on an integrating stage number, a decimator factor, and a comb differential delay of the decimator CIC filter to generate the cumulatively amplified periodic count value.

The touch detector may be further configured to receive the count value, differentiate the count value to generate a difference value, compare the difference value with a comparison value, and generate, as the touch detection signal, a signal having a level indicating whether the touch has occurred based on a result of the comparing.

The touch detector may include a delay part configured to receive the count value and a delay control signal, and delay the count value by a delay time determined by the delay control signal to generate a delayed count value; a subtraction part configured to receive the count value and the delayed count value, and subtract the count value from the delayed count value, or subtract the delayed count value from the count value, to generate a difference value; and a comparison part configured to receive the difference value, compare the difference value with a comparison value, and generate, as the touch detection signal, a signal having a high level or a low level determined based on a result of the comparing.

The comparison part may be further configured to compare the difference value with an upper limit comparison value to determine whether to switch the touch detection signal from the low level to the high level, where the upper limit comparison value may be equal to a first fraction of a maximum value of the difference value, and compare the difference value with a lower limit comparison value to determine whether to switch the touch detection signal from the high level to the low level, where the lower limit comparison value may be equal to a second fraction of the maximum value of the difference value, and may be less than the upper limit comparison value.

The digital frequency counter may include a frequency down-converter configured to receive the resonance signal as a reference clock signal, and divide the reference clock signal by a reference frequency division ratio to generate a divided reference clock signal; a periodic timer configured to receive the reference frequency signal as a sample clock signal, receive the divided reference clock signal, and count the sample clock signal during one time period of the divided reference clock signal to generate a periodic count value; and a cascaded integrator-comb (CIC) filter circuit configured to receive the periodic count value, and cumulatively amplify the periodic count value to generate the count value.

In another general aspect, an electronic device includes a housing; a touch input unit including a first touch member integrated with the housing; a resonant circuit configured to generate a resonance signal having a resonant frequency that varies based on a touch of the touch input unit; a digital frequency counter configured to count a reference frequency signal based on the resonance signal, or count the resonance signal based on the reference frequency signal, to generate a count value; and a touch detector configured to detect whether the touch of the touch input unit has occurred based on the count value generated by the digital frequency counter, and output a touch detection signal indicating whether the touch has occurred.

The housing may include a specific material, and the first touch member may include the specific material.

The touch input unit may further include a second touch member integrated with the housing and disposed at a position different from a position of the first touch member, and the second touch member may include the specific material.

The touch input unit may further include a second touch member integrated with the housing and disposed at a position different from a position of the first touch member; and an insulating member disposed between the first touch member and the second touch member, between the first touch member and the housing, and between the second touch member and the housing.

The touch input unit may further include a second touch member integrated with the housing and disposed at a position different from a position of the first touch member, the first touch member may include a first metal member, and a first insulating member covering a portion of the first metal member, the second touch member may include a second metal member, and a second insulating member covering a portion of the second metal member, and the first metal member may be electrically insulated from the second metal member by the first insulating member and the second insulating member.

The touch input unit may further include a second touch member integrated with the housing and disposed at a position different from a position of the first touch member, the first touch member may include a first insulating member, and the second touch member may include a second insulating member separated from the first insulating member by the housing.

The first touch member may further include a first metal member integrated with the housing and covering a portion of the first insulating member.

The housing may include a material, the first touch member may further include a first insulating member, and a first metal member integrated with the housing and covering the first insulating member, where the first insulating member may include a material different from the material of the housing, and the touch input unit may further include a second touch member including a second insulating member and a second metal member integrated with the housing and covering the second insulating member, where the second insulating member may include a material different from the material of the housing; and an isolation member electrically isolating the first touch member and the second touch member from each other.

The resonant circuit may include an inductance circuit having an inductance and including a first coil element disposed on an inner surface of the first touch member, or spaced apart from the inner surface of the first touch member; and a capacitance circuit having a capacitance and including a capacitance element connected to the inductance circuit, wherein the capacitance circuit may be configured so that the capacitance of the capacitance circuit increases based on the touch of the touch input unit.

The first coil element may be mounted on a substrate and may be disposed on the inner surface of the first touch member.

The first coil element may be mounted on a substrate and may be spaced apart from the inner surface of the first touch member.

The digital frequency counter may be further configured to divide the reference frequency signal by a reference frequency division ratio to generate a divided reference clock signal, and count the resonance signal based on the divided reference clock signal to generate the count value.

The digital frequency counter may be further configured to divide the reference frequency signal by a reference frequency division ratio to generate a divided reference clock signal, divide the resonance signal by a sensing frequency division ratio to generate a divided resonance signal, and count the divided resonance signal based on the divided reference clock signal to generate the count value.

The digital frequency counter may include a frequency down-converter configured to receive the reference frequency signal as a reference clock signal, and divide the reference clock signal by a reference frequency division ratio to generate a divided reference clock signal; a periodic timer configured to receive the resonance signal as a sample clock signal, receive the divided reference clock signal, and count the sample clock signal during one time period of the divided reference clock signal to generate a periodic count value; and a cascaded integrator-comb (CIC) filter circuit configured to receive the periodic count value, and cumulatively amplify the periodic count value to generate the count value.

The CIC filter circuit may include a decimator CIC filter configured to receive the periodic count value, and cumulatively amplify the periodic count value to generate a cumulatively amplified periodic count value; and a first-order CIC filter configured to receive the cumulatively amplified periodic count value, and calculate a moving average of the cumulatively amplified periodic count value to remove noise from the cumulatively amplified periodic count value and generate the count value.

The decimator CIC filter may be further configured to cumulatively amplify the periodic count value by a cumulative gain determined based on an integrating stage number, a decimator factor, and a comb differential delay of the decimator CIC filter to generate the cumulatively amplified periodic count value.

The touch detector may be further configured to receive the count value, differentiate the count value to generate a difference value, compare the difference value with a comparison value, and generate, as the touch detection signal, a signal having a level indicating whether the touch has occurred based on a result of the comparing.

The touch detector may include a delay part configured to receive the count value and a delay control signal, and delay the count value by a delay time determined by the delay control signal to generate a delayed count value; a subtraction part configured to receive the count value and the delayed count value, and subtract the count value from the delayed count value, or subtract the delayed count value from the count value, to generate a difference value; and a comparison part configured to receive the difference value, compare the difference value with a comparison value, and generate, as the touch detection signal, a signal having a high level or a low level determined based on a result of the comparing.

The comparison part may be further configured to compare the difference value with an upper limit comparison value to determine whether to switch the touch detection signal from the low level to the high level, where the upper limit comparison value may be equal to a first fraction of a maximum value of the difference value, and compare the difference value with a lower limit comparison value to determine whether to switch the touch detection signal from the high level to the low level, where the lower limit comparison value may be equal to a second fraction of the maximum value of the difference value, and may be less than the upper limit comparison value.

The digital frequency counter may include a frequency down-converter configured to receive the resonance signal as a reference clock signal, and divide the reference clock signal by a reference frequency division ratio to generate a divided reference clock signal; a periodic timer configured to receive the reference frequency signal as a sample clock signal, receive the divided reference clock signal, and count the sample clock signal during one time period of the divided reference clock signal to generate a periodic count value; and a cascaded integrator-comb (CIC) filter circuit configured to receive the periodic count value, and cumulatively amplify the periodic count value to generate the count value.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
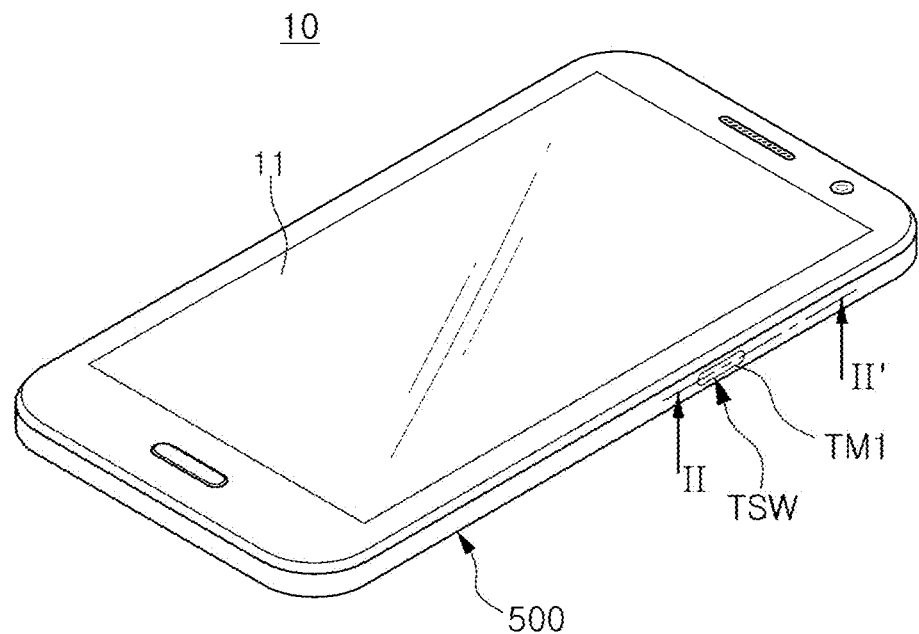
FIGS. 1A and 1B are appearance diagrams of examples of mobile devices including a touch input sensing apparatus of this application.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
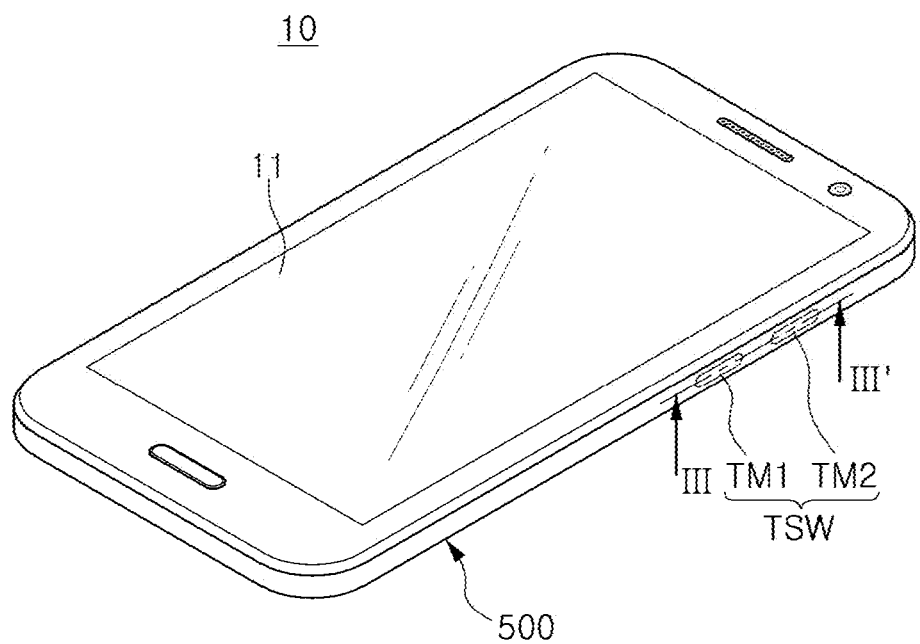

FIGS. 1A and 1B are appearance diagrams of examples of mobile devices including a touch input sensing apparatus of this application.

Referring to FIG. 1A, a mobile device 10 includes a touch screen 11, a housing 500, and a touch input unit TSW including a first touch member TM1 replacing a mechanical button switch.

Referring to FIG. 1B, a mobile device 10 includes a touch screen 11, a housing 500, and a touch input unit TSW including first and second touch members TM1 and TM2 replacing mechanical button switches.

In FIG. 1B, the touch input unit TSW is illustrated as including the first and second touch members TM1 and TM2. However, this is a just an example for ease of description, and the touch input unit TSW is not limited to the two touch members TM1 and TM2, and it will be understood that the number of touch members may be extended in the same manner as the first and second touch members.

As an example, referring to FIGS. 1A and 1B, the mobile device 10 may be a portable device such as a smartphone or a wearable device such as a smartwatch, but is not limited to any specific device. The mobile device 10 may be a portable or wearable electric device, or any electric device having a switch for operation control.

The housing 500 may be an external case of an electric device. For example, when the touch input sensing apparatus is applied to a mobile device, the housing 500 may be a cover disposed on a side (a side surface) of the mobile device 10. As an example, the housing 500 may be integrated with a cover disposed on a back surface of the mobile device 10, or may be separate from the cover disposed on the back surface of the mobile device 10.

As described above, the housing 500 may be an external case of the electric device, and is not limited to any particular position, shape, or structure.

Referring to FIG. 1B, each of the first and second touch members TM1 and TM2 is disposed inside the housing 500 of the mobile device 10, but a disposition thereof is not limited thereto.

The first and second touch members TM1 and TM2 may be disposed on the cover of the mobile device 10. In this case, the cover may be a cover excluding a touch screen, for example, a side cover, a back cover, or a cover that may be disposed on a portion of a front surface. For ease of description, a housing disposed on a side cover of a mobile device will be described as an example, but the housing is not limited thereto.

Figure 2:
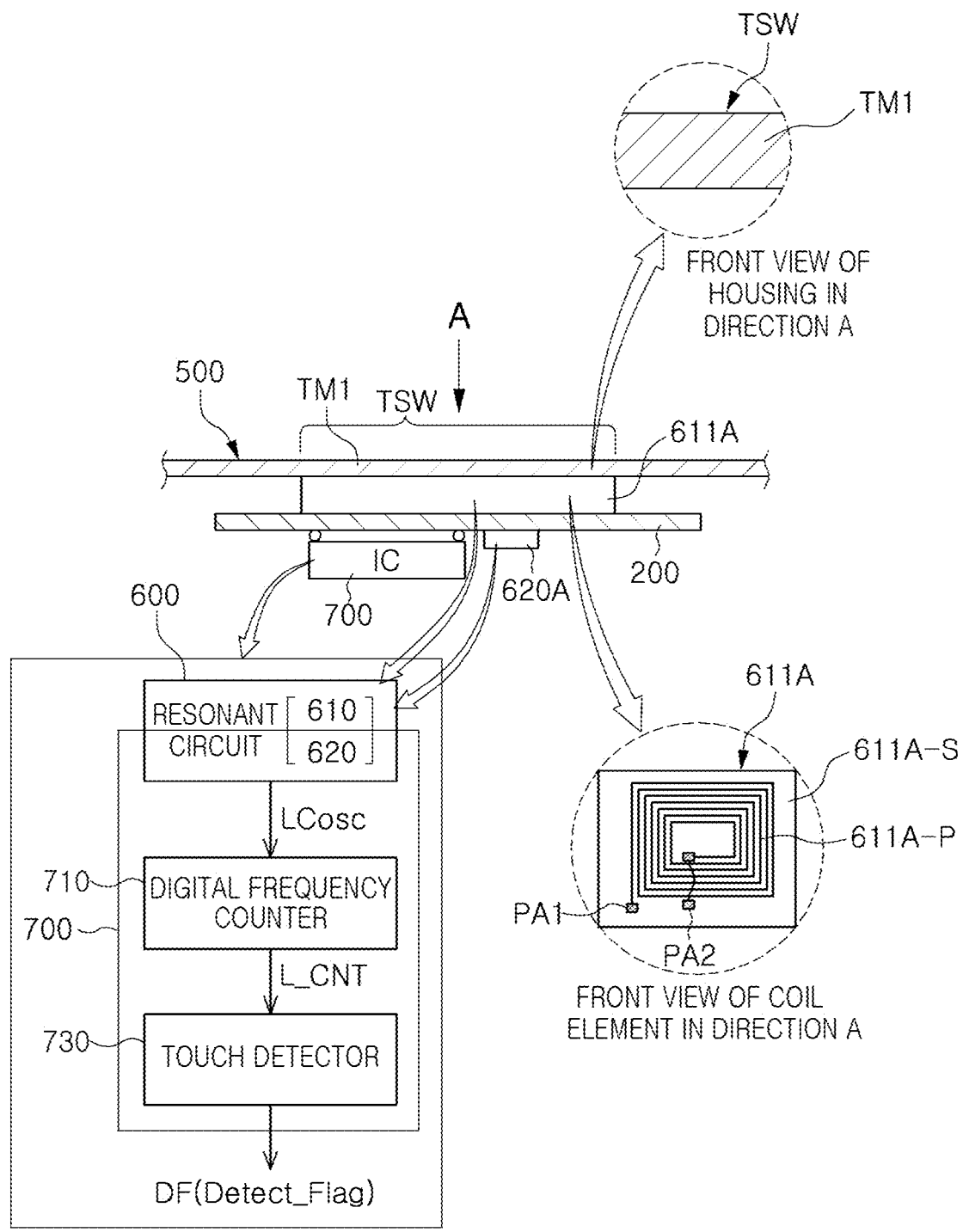
FIG. 2 is a cross-sectional view, taken along the line II-II' in FIG. 1A, illustrating an example of a structure of a touch input sensing apparatus in FIG. 1A.

FIG. 2 is a cross-sectional view, taken along the line II-II' in FIG. 1A, illustrating an example of a structure of a touch input sensing apparatus in FIG. 1A.

Referring to FIG. 2, a touch input sensing apparatus includes a touch input unit TSW, a resonant circuit 600, a digital frequency counter 710, and a touch detector 730.

The touch input unit TSW includes at least one first touch member TM1 integrated with a housing 500 of an electric device.

The resonant circuit 600 generates a resonance signal LCosc having a resonant frequency fres varying based on a touch of the touch input unit TSW. For example, the resonant circuit 600 includes an inductance circuit 610 and a capacitance circuit 620.

The digital frequency counter 710 converts a resonance signal from the resonant circuit 600 into a count value L_CNT, which is a digital value. For example, the digital frequency counter 710 converts the resonance signal LCosc into the count value L_CNT by counting a number of cycles of the resonance signal LCosc in a predetermined period.

The touch detector 730 detects whether a touch input has occurred, based on the count value L_CNT received from the digital frequency counter 710, to output a touch detection signal DF (Detect_Flag).

A first example of the touch input unit TSW will be described with reference to a front view of a housing in a direction A in FIG. 2.

For example, the touch input unit TSW includes a first touch member TM1, and the first touch member TM1 is integrated with the housing 500. Thus, the first touch member TM1 is made of the same material as the housing 500.

For example, when the housing 500 is made of a conductive material such as a metal, the first touch member TM1 is also made of the conductive material. When the housing 500 is made of an insulating material such as plastic, the first touch member TM1 is also made of the insulating material.

Referring to a front view of a coil element in the direction A in FIG. 2, the inductance circuit 610 includes a first coil element 611A, disposed on an inner surface of the first touch member TM1, having an inductance Lind.

In this application, an inner surface of a touch member integrated with a housing is a surface of the touch member that is inside the housing, and an outer surface of the touch member integrated with the housing is a touch member that is outside the housing.

Figure 11:
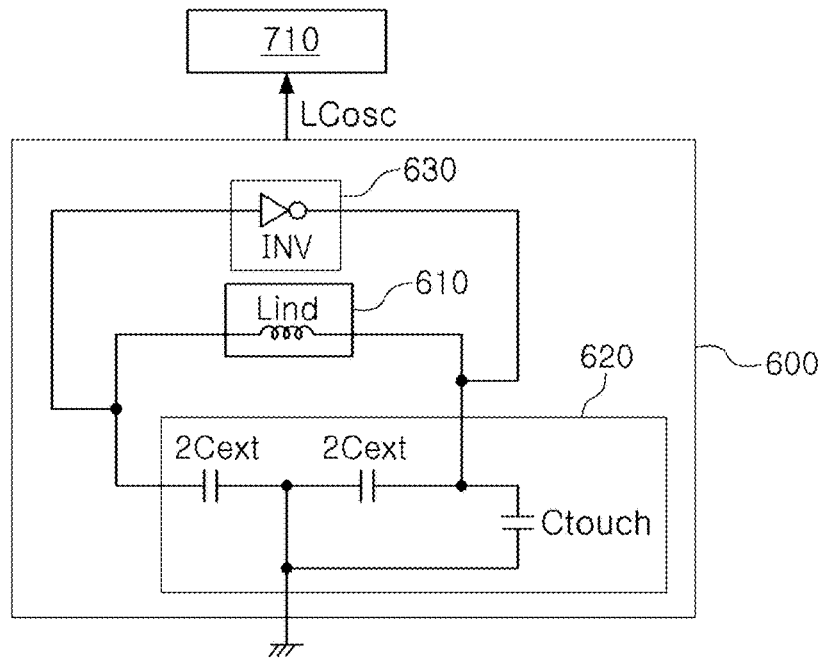
FIG. 11 is a circuit diagram of the resonant circuit in FIG. 9 when touched.

The capacitance circuit 620 includes a capacitance element 620A having a capacitance Cext connected to the inductance circuit 610. For example, the capacitance of the capacitance circuit 620 includes a touch capacitance Ctouch generated when the touch input unit TSW is touched, and the touch capacitance Ctouch (see FIG. 11) is generated, as illustrated in FIG. 11, to increase the overall capacitance of the resonant circuit 600.

A disposition position of the first coil element 611A will be described later with reference to FIGS. 13A and 13B.

As an example, the first coil element 611A includes a coil pattern 611A-P having a spiral shape connected between a first pad PA1 and a second pad PA2 disposed on a PCB substrate 611A-S.

Referring to FIG. 2, the first coil element 611A is disposed on one surface (for example, an upper surface) of a substrate 200, and a circuit part 700 and a capacitance element 620A such as a multilayer ceramic capacitor (MLCC), or other type of capacitor, is disposed on the other surface (for example, a lower surface) of the substrate 200.

As an example, the circuit part 700 may be an integrated circuit (IC) including a portion of the resonant circuit 600, the digital frequency counter 710, and the touch detector 730.

The substrate 200 may be a printed circuit board (PCB) or a flexible printed circuit board (FPCB), but is not limited thereto. The substrate 200 may be a board on which a circuit pattern is formed, (for example, one of various circuit boards such as a PCB) or a panel (for example, a panel for a panel level package (PLP)).

The structure of the touch input sensing apparatus shown in FIG. 2 is just an example, and is not limited thereto.

The first touch member TM1 has been described in FIG. 2, but the description of the first touch member TM1 is also applicable to the second touch member TM2 (see FIG. 1B). For example, when the first touch member TM1 and the second touch member TM2 are included, a single circuit part 700 may process signals, having different resonant frequencies, respectively corresponding to the first touch member and the second touch member TM1 and TM2.

When describing the drawings of this application, repeated descriptions may be omitted for components having the same reference numeral and the same function, and only differences will be described.

Examples of a touch input sensing apparatus described below may include a plurality of touch members. In this case, the plurality of touch members may be arranged in a line. Alternatively, the plurality of touch members may be arranged horizontally and vertically in a matrix arrangement.

The examples of the touch input sensing apparatus illustrated in FIGS. 3 to 8B include the first and second touch members TM1 and TM2. However, the first and second touch members TM1 and TM2 illustrated in FIGS. 3 to 8B are just an example for ease of description, and touch members of the touch input sensing apparatus are not limited to the first and second touch members TM1 and TM2.

As described above, referring to the description of the first and second touch members TM1 and TM2, it will be understood that the touch input sensing apparatus may include one touch member, two touch members, or three or more touch members.

In the examples described in this application, the touch member (one of the plurality of touch members) is integrated with the housing 500. In this case, the term "integrated" refers to the fact that irrespective of whether the material of the touch member and the material of the housing 500 are the same as each other or are different from each other, the touch member and the housing 500 are manufactured as a single body so that they cannot be separated from each other after manufacturing thereof and have a unitary structure, not a mechanically separable structure, in which there is no gap between the touch member and the housing 500.

Figure 3:
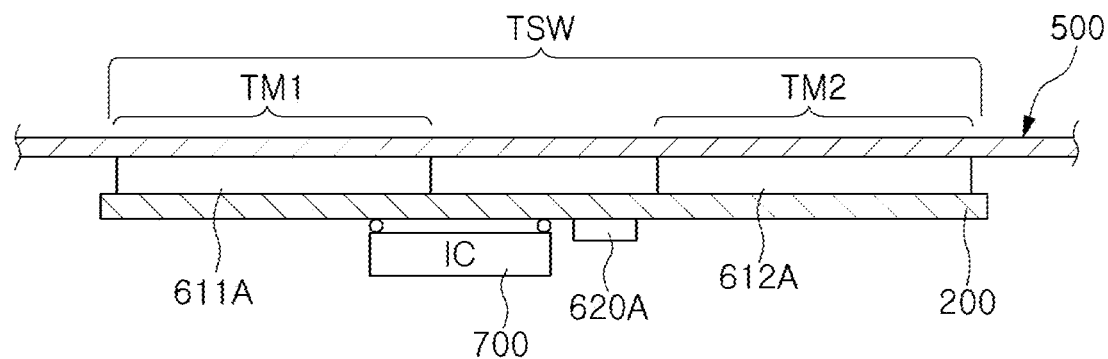
FIG. 3 is a cross-sectional view, taken along the line III-III' in FIG. 1B, illustrating an example of a structure of a touch input sensing apparatus in FIG. 1B.

FIG. 3 is a cross-sectional view, taken along the line III-III' in FIG. 1B, illustrating an example of a structure of a touch input sensing apparatus in FIG. 1B.

Referring to FIG. 3, a touch input sensing apparatus includes a touch input unit TSW including a first touch member TM1 and a second touch member TM2.

Each of the first and second touch members TM1 and TM2 is integrated with a housing 500.

In addition, the inductance circuit 610 of the resonant circuit 600 (in FIG. 2) includes a first coil element 611A and a second coil element 612A, and the capacitance circuit 610 of the resonant circuit 600 (in FIG. 2) includes a capacitance element 620A. The first coil element 611A, the second coil element 612A, the capacitance element 620A, and the circuit part 700 are mounted on the substrate 200.

The first coil element 611A is disposed on an inner surface of the first touch member TM1, and the second coil element 612A is disposed on an inner surface of the second touch member TM2. The positions of the first and second coil elements 611A and 612A relative to the first and second touch members TM1 and TM2 will be described in further detail with reference to FIGS. 13A and 13B.

The first touch member TM1 and the second touch member TM2 are made of the same material as the housing 500.

As an example, when the housing 500 is made of a conductive material such as a metal, the first touch member TM1 and the second touch member TM2 are also made of the conductive material. When the housing 500 is made of an insulating material such as a plastic, the first touch member TM1 and the second touch member TM2 are also made of the insulating material.

The first coil element 611A and the second coil element 612A are disposed on one surface (for example, an upper surface) of the substrate 200, and a circuit part 700 and a capacitance element 620A such as an MLCC, or other type of capacitor, are disposed on the other surface (for example, a lower surface) of the substrate 200. However, such a structure is just an example and is not limited thereto.

The first and second coil elements 611A and 612A are spaced apart from each other on one surface of the substrate 200 and are connected to a circuit pattern formed on the substrate 200. For example, each of the first and second coil elements 611A and 612A may be an individual coil element such as a solenoid coil, a winding-type inductor, a chip inductor, or other type of individual coil element. However, each of the first and second coil elements 611A and 612A is not limited thereto, and may be any element having an inductance.

For example, when a conductive material constituting the first and second touch members TM1 and TM2 is a metal having a high resistivity, interference between the first and second touch members TM1 and TM2 may be reduced, and thus the first and second touch members TM1 and TM2 may be actually applied to an electric device.

Figure 4:
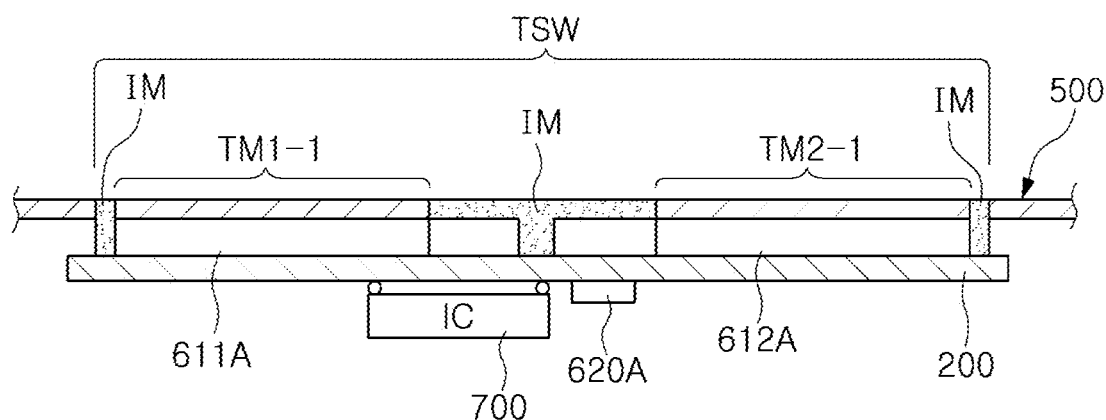
FIG. 4 is a cross-sectional view, taken along the line III-III' in FIG. 1B, illustrating another example of the structure of the touch input sensing apparatus in FIG. 1B.

FIG. 4 is a cross-sectional view, taken along the line III-III' in FIG. 1B, illustrating another example of the structure of the touch input sensing apparatus in FIG. 1B.

Referring to FIG. 4, the touch input unit TSW of the touch input sensing apparatus includes a first touch member TM1-1, a second touch member TM2-1, and an insulating member IM.

The first and second touch members TM1-1 and TM2-1 are made of the same material as the housing 500.

The insulating member IM is disposed between the first touch member TM1-1 and the second touch member TM2-1, between the first touch member TM1-1 and the housing 500, and between the second touch member TM2-1 and the housing 500.

The insulating member IM electrically isolates the housing 500 and the first touch member TM1-1 from each other, electrically isolates the housing 500 and the second touch member TM2-1 from each other, and electrically isolates the first and second touch members TM1-1 and TM2-1 from each other.

For example, each of the first touch member TM1-1, corresponding to the first coil element 611A, and the second touch member TM2-1, corresponding to the second coil element 612A, is made of a conductive material.

The insulating member IM may be an insulator, such as a nonconductive material through which electricity does not pass, and is made, for example, of a plastic.

Referring to FIG. 4, the first touch member TM1-1 and the second touch member TM2-1, each being a conductor, are separated from each other by the insulating member IM. The first touch member TM1-1 and the second touch member TM2-1, each being a conductor, each have a floating structure or an island structure separated from each other and from the housing 500 by the insulating member IM.

Other examples of such a floating structure or an island structure will be described later with reference to FIGS. 5A and 5B, FIG. 6, FIGS. 7A and 7B, and FIGS. 8A and 8B.

In this application, an island structure (or a floating structure) refers to a structure in which a touch member (any one of a plurality of touch members) is electrically isolated from the housing 500.

In this application, the insulating member IM is sufficient to provide a function for electrical insulation of the first and second touch members TM1-1 and TM2, and is not limited in shape and structure.

Figure 5A:
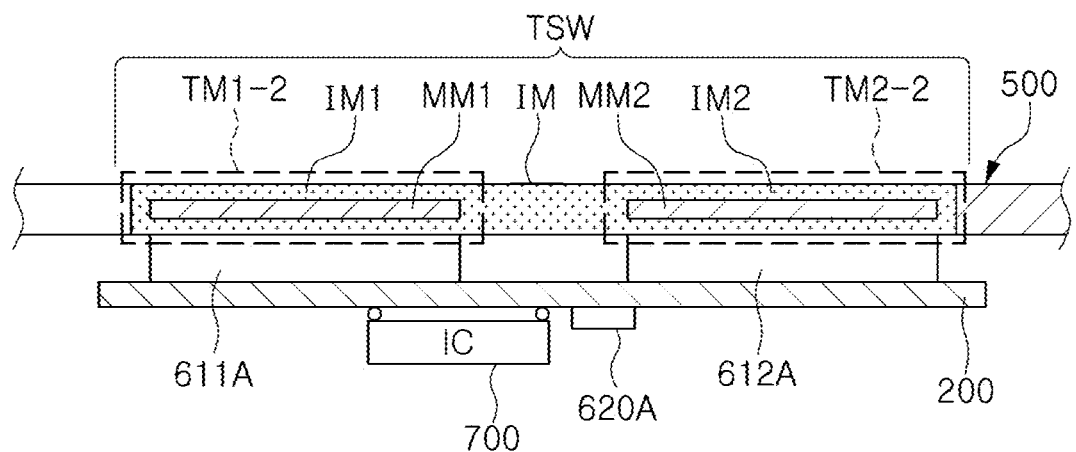
FIGS. 5A and 5B are cross-sectional views, taken along the line III-III' in FIG. 1B, illustrating other examples of the structure of the touch input sensing apparatus in FIG. 1B.
Figure 5B:
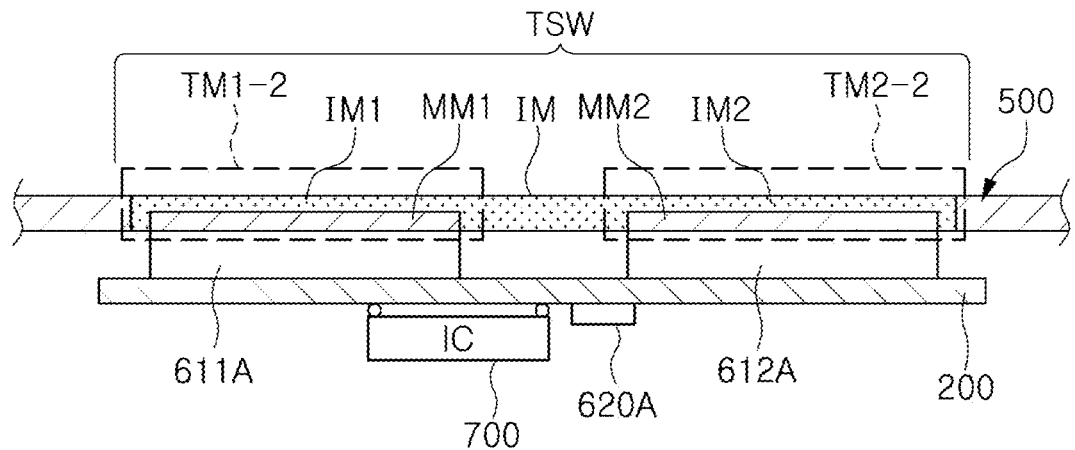

FIGS. 5A and 5B are cross-sectional views, taken along the line III-III' in FIG. 1B, illustrating other examples of the structure of the touch input sensing apparatus in FIG. 1B.

Referring to FIGS. 5A and 5B, the touch input unit TSW of the touch input sensing apparatus includes a first touch member TM1-2 and a second touch member TM2-2.

The first touch member TM1 includes a first metal member MM1 and a first insulating member IM1, and the first insulating member IM1 is provided to cover at least a portion of the first metal member MM1.

The second touch member TM2 includes a second metal member MM2 and a second insulating member IM2, and the second insulating member IM2 is provided to cover at least a portion of the second metal member MM2.

The first metal member MM1 is electrically insulated from the second metal member MM2 by the first insulating member IM1 and the second insulating member IM2. In this case, the first coil element 611A is disposed on an inner surface of the first touch member TM1-3, and the second coil element 612A is disposed on an inner surface of the second touch member TM2-3.

Referring to FIG. 5A, the first touch member TM1-2 includes a first metal member MM1 and a first insulating member IM1, and the first insulating member IM1 is provided to cover the entirety of the first metal member MM1.

The second touch member TM2-2 includes a second metal member MM2 and a second insulating member IM2, and the second insulating member IM2 is provided to cover the entirety of the second metal member MM2.

In the example in FIG. 5A, the first insulating member IM1 and the second insulating member IM2 are undivided portions of a unitary insulating member IM, but are not limited thereto.

Referring to FIG. 5B, the first touch member TM1-2 includes a first metal member MM1 and a first insulating member IM1, and the first insulating member IM1 is provided to cover portions (an upper surface and side surfaces in FIG. 5B) of the first metal member MM1.

The second touch member TM2-2 includes a second metal member MM2 and a second insulating member IM2, and the second insulating member IM2 is provided to cover portions (an upper surface and side surfaces in FIG. 5B) of the second metal member MM2.

In the example in FIG. 5B, the first insulating member IM1 and the second insulating member IM2 are undivided portions of a unitary insulating member IM, but are not limited thereto.

The first touch member TM1-2 and the second touch member TM2-2 are respectively at least partially surrounded by the first and second insulating members IM1 and IM2 to have a floating structure or an island structure electrically isolated by the first and second insulating members IM1 and IM2.

Referring to FIG. 5A, each of the first and second touch members TM1-2 and TM2-2 has a floating structure or an island structure in which all surfaces including upper, lower, and side surfaces thereof are surrounded by a respective one of the first and second insulating members IM1 and IM2.

In contrast, referring to FIG. 5B, each of the first and second touch members TM1-2 and TM2-2 has a floating structure or an island structure in which some surfaces (an upper surface and side surfaces) thereof are surrounded by a respective one of the first and second insulating layers IM1 and IM2, and a remaining surface (a lower surface) thereof is not surrounded by the respective one of the first and second insulating layers IM1 and IM2.

Figure 6:
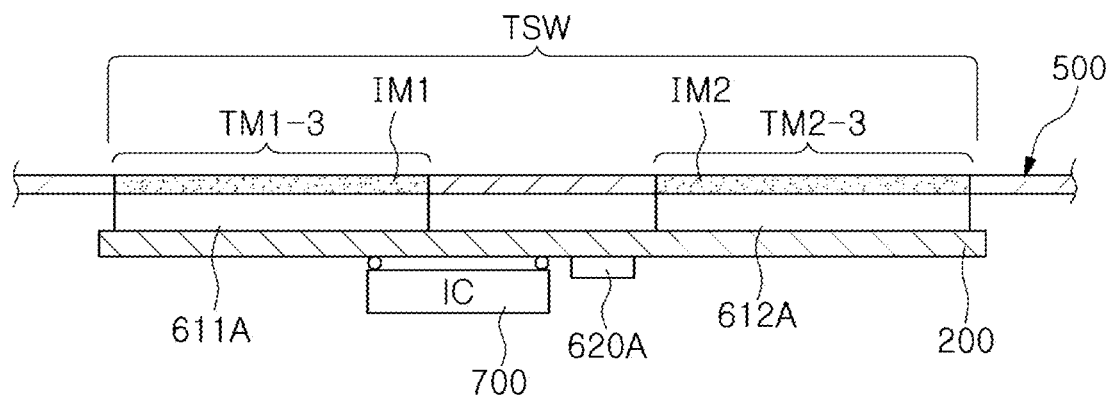
FIG. 6 is a cross-sectional view, taken along the line III-III' in FIG. 1B, illustrating another example of the structure of the touch input sensing apparatus in FIG. 1B.

FIG. 6 is a cross-sectional view, taken along the line III-III' in FIG. 1B, illustrating another example of the structure of the touch input sensing apparatus in FIG. 1B.

Referring to FIG. 6, the touch input unit TSW of the touch input sensing apparatus includes a first touch member TM1-3 and a second touch member TM2-3 integrated into a unitary member with the housing 500.

The first touch member TM1 includes a first insulating member IM1, and the second touch member TM2 includes a second insulating member IM2. The second insulating member IM2 is separated from the first insulating member IM1 by the housing 500. In this case, the first coil element 611A is disposed on an inner surface of the first touch member TM1-3, and the second coil element 612A is disposed on an inner surface of the second touch member TM2-3.

The first and second touch members TM1-3 and TM2-3 are made of a material different from a material of the housing 500.

In this application, a touch member, such as the first touch member TM1, TM1-1, TM1-2, or TM1-3 or the second touch member TM2, TM2-1, TM2-2, or TM2-3 is integrated with the housing 500 of the electric device, and is a touch area for a touch input. The touch member is not limited to any specific material and may be, for example, a conductive member or an insulating member.

The touch member includes an external surface to be touched. and an inner surface to which the coil element 611A or 612A is attached.

For example, the housing 500 of the electric device, in which the touch input unit TSW is disposed, may be a conductive member. In this case, the touch input unit may be covered, coated, or painted using an insulating material. In this regard, the touch member may also be a conductive member, and may be covered, coated, or painted using an insulating material. For example, the insulating material is a material having a negligibly low electrical conductivity and may be, for example, a plastic or an oxide film. However, the insulating material is not limited thereto, and may be any electrical insulator.

In one example, the conductor constituting the first and second touch members TM1 and TM2 illustrated in FIG. 3 may be a metal having a high resistivity. As an example, the resistance of the first and second touch members TM1 and TM2 may be 100 kΩ or more.

The first and second coil elements 611A and 612A are spaced apart from each other on one surface of the substrate 200 facing the first and second touch members TM1 and TM2. A circuit part 700 and a capacitance element 620A such as an MLCC, or other type of capacitor, are disposed on the other surface of the substrate 200 facing away from the first and second touch members TM1 and TM2.

In another example, a circuit part 700 and a capacitance element 620A such as an MLCC, or other type of capacitor, are disposed on the one surface of the substrate 200, and the first and second coil elements 611A are spaced apart from each other on the other surface of the substrate 200.

As described above, the positions of the first and second coil elements 611A and 612A, the circuit part 700, and the capacitance element 620A are not limited as long as they can be electrically connected to each other.

As illustrated in FIG. 6, when each of the first touch member (TM1-3) and the second touch member (TM2-3) is made of an insulator and is integrated with the housing 500, which is a conductor, each of the first touch member TM1-3 and the second touch member TM2-3 is electrically isolated from the housing 500. The insulator is a nonconductive material through which electricity does not pass, and may be, for example, a plastic or an oxide layer.

Figure 7A:
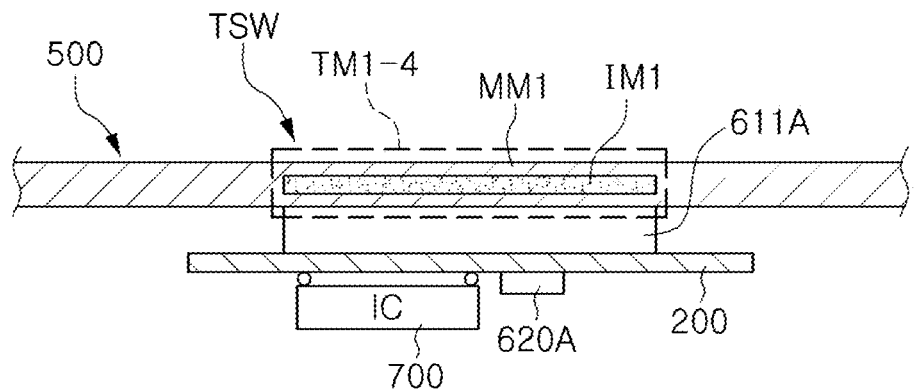
FIGS. 7A and 7B are cross-sectional views, taken along the line II-II' in FIG. 1A, illustrating other examples of the structure of the touch input sensing apparatus in FIG. 1A.
Figure 7B:
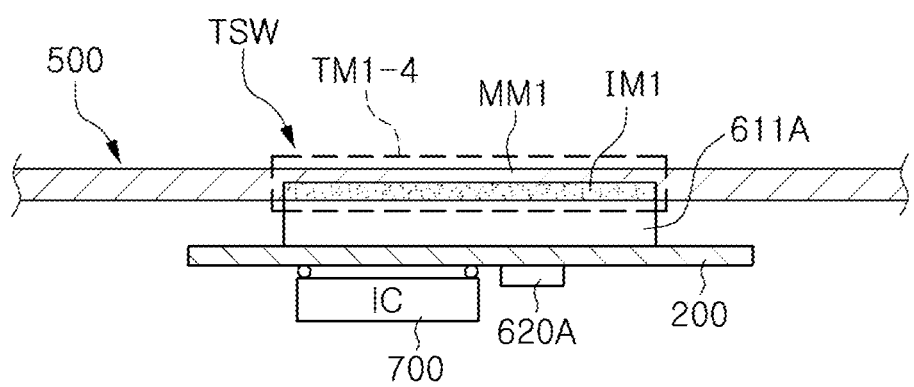

FIGS. 7A and 7B are cross-sectional views, taken along the line Ill l' in FIG. 1A, illustrating other examples of the structure of the touch input sensing apparatus in FIG. 1A.

Referring to FIGS. 7A and 7B, the touch input unit TSW of the touch input sensing apparatus includes a first touch member TM1.

Referring to FIG. 7A, the first touch member TM1-4 includes a first insulating member IM1 and a first metal member MM1. The first metal member MM1 is integrated with the housing 500, and covers the entirety of the first insulating member IM1 (an upper surface, a lower surface, and side surfaces).

Referring to FIG. 7B, the first touch member TM1-4 includes a first insulating member IM1 and a first metal member MM1. The first metal member MM1 is integrated with the housing 500, and covers only a portion (an upper surface and side surfaces) of the first insulating member IM1.

Referring to FIG. 7B, a lower surface of the first touch member TM1-4 is not surrounded by the first metal member MM1.

Figure 8A:
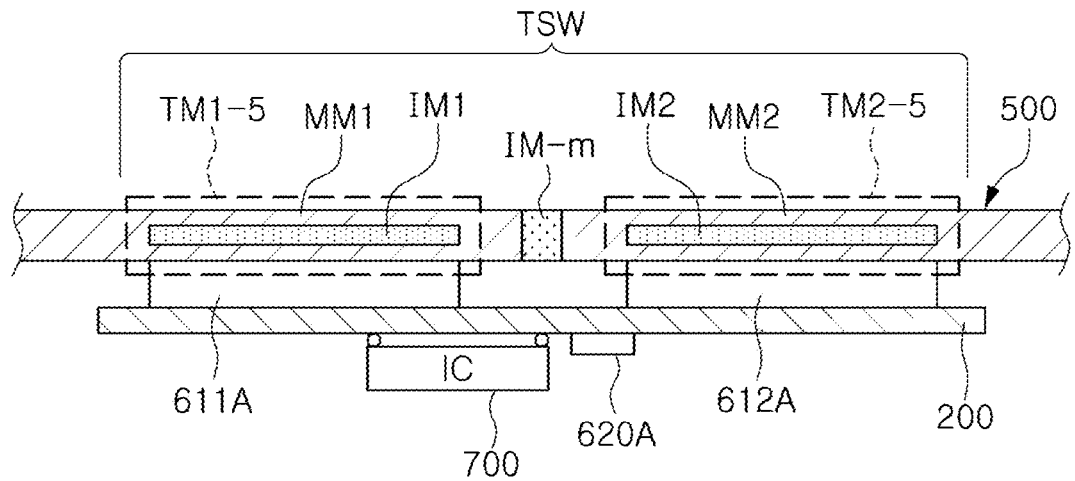
FIGS. 8A and 8B are cross-sectional views, taken along the line III-III' in FIG. 1B, illustrating other examples of the structure of the touch input sensing apparatus in FIG. 1B.
Figure 8B:
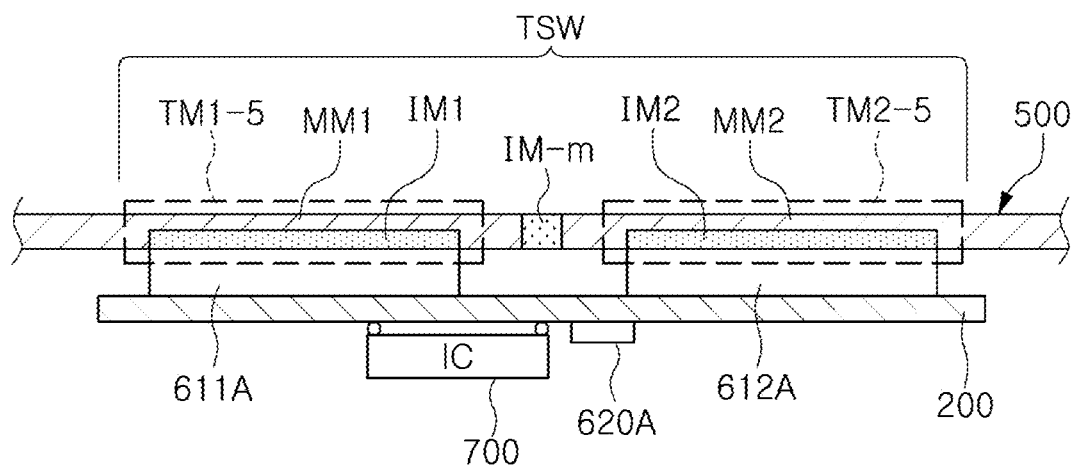

FIGS. 8A and 8B are cross-sectional views, taken along the line III-III' in FIG. 1B, illustrating other examples of the structure of the touch input sensing apparatus in FIG. 1B.

Referring to FIGS. 8A and 8B, the touch input unit TSW of the touch input sensing apparatus includes a first touch member TM1-5, a second touch member TM2-5, and an isolation member IM-m.

Referring to FIG. 8A, the first touch member TM1-5 includes a first insulating member IM1, made of a material different from a material of the housing 500, and a first metal member MM1, integrated with the housing 500, covering the entirety of the first insulating member IM1.

The second touch member TM2-5 includes a second insulating member IM2, made of a material different from the material of the housing 500, and a second metal member MM2, integrated with the second insulating member IM2, covering the entirety of the second insulating member IM2.

The isolation member IM-m is integrated with the housing 500 and is disposed between the first touch member TM1-5 and the second touch member TM2-5 to electrically isolate the first touch member TM1-5 and the second touch member TM2-5 from each other.

Referring to FIG. 8B, the first touch member TM1-5 includes a first insulating member IM1, made of a material different from a material of the housing 500, and a metal member MM1, integrated with the housing 500, covering a portion (an upper surface and side surfaces) of the second insulating member IM1.

The second touch member TM2-5 includes a second insulating member IM2, made a material different from the material of the housing 500, and a second metal member MM2, integrated with the housing 500, covering a portion (an upper surface and side surfaces) of the second insulating member IM2.

The isolation member IM-m is integrated with the housing 500 and is disposed between the first touch member TM1-5 and the second touch member TM2-5 to electrically isolate the first touch member TM1-5 and the second touch member TM2-5 from each other.

In both FIGS. 8A and 8B, the first coil element 611A is disposed on an inner surface of the first touch member TM1-5, and the second coil element 612A is disposed on an inner surface of the second touch member TM2-5.

Accordingly, each of the first touch member TM1-5 and the second touch member TM2-5 has a floating structure or an island structure in which a portion or the entirety of a respective one of the first insulating member IM1 and the second insulating member IM2 is covered by a respective one of the first metal member MM1 and the second metal each integrated with the housing 500.

As described with reference to FIGS. 2 to 8B, a touch member (any touch member among a plurality of touch members) of this application is integrated with the housing 500 and is provided with a corresponding coil element disposed on an inner surface thereof to process a touch input.

Hereinafter, a process of processing a touch input will be described.

Figure 9:
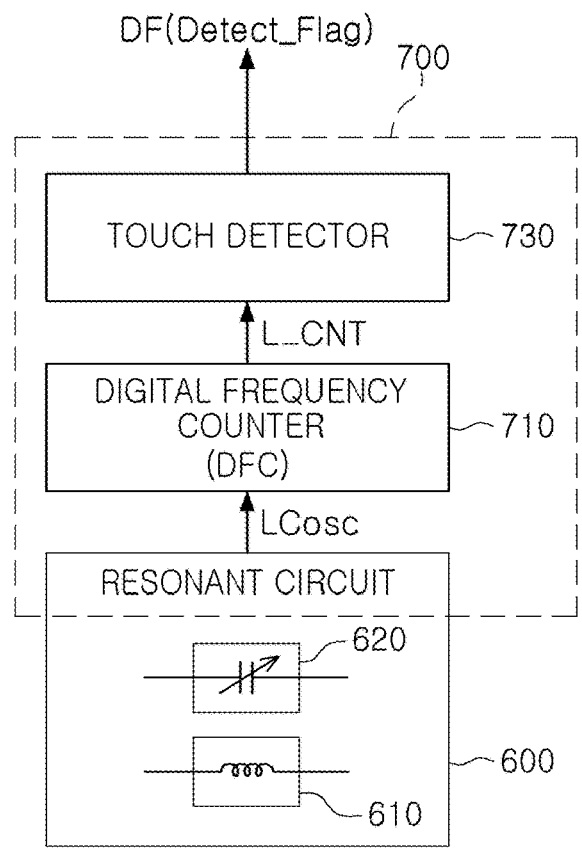
FIG. 9 is a block diagram of an example of a resonant circuit and a circuit part of a touch input sensing apparatus.

FIG. 9 is a block diagram of an example of a resonant circuit and a circuit part of a touch input sensing apparatus.

Referring to FIG. 9, a touch input sensing apparatus includes a resonant circuit 600, a digital frequency counter 710, and a touch detector 730. The resonant circuit 600 includes an inductance circuit 610, a capacitance circuit 620, and an inverter circuit 630. The inverter circuit 630 includes at least one inverter INV, and enables the resonant circuit 600 to maintain a resonance signal.

In one example, the resonant circuit 600 is an LC resonant circuit, but is not limited thereto. The resonant circuit 600 is configured to generate a resonance signal based on a capacitance or an inductance that varies depending on a touch.

The circuit part 700 includes a portion of the resonant circuit 600, a digital frequency counter 710, and a touch detector 730. In this case, a portion of the resonant circuit 600 is an inverter circuit 630 (in FIGS. 10-12).

The circuit part 700 may or may not include a capacitance element. When a capacitance element is not included in the circuit part 700, the touch input sensing apparatus may include a capacitance element 620A such as an MLCC disposed independently of the circuit part 700 as shown in FIGS. 2-8B. The circuit part 700 may or may not be an integrated circuit.

Figure 18:
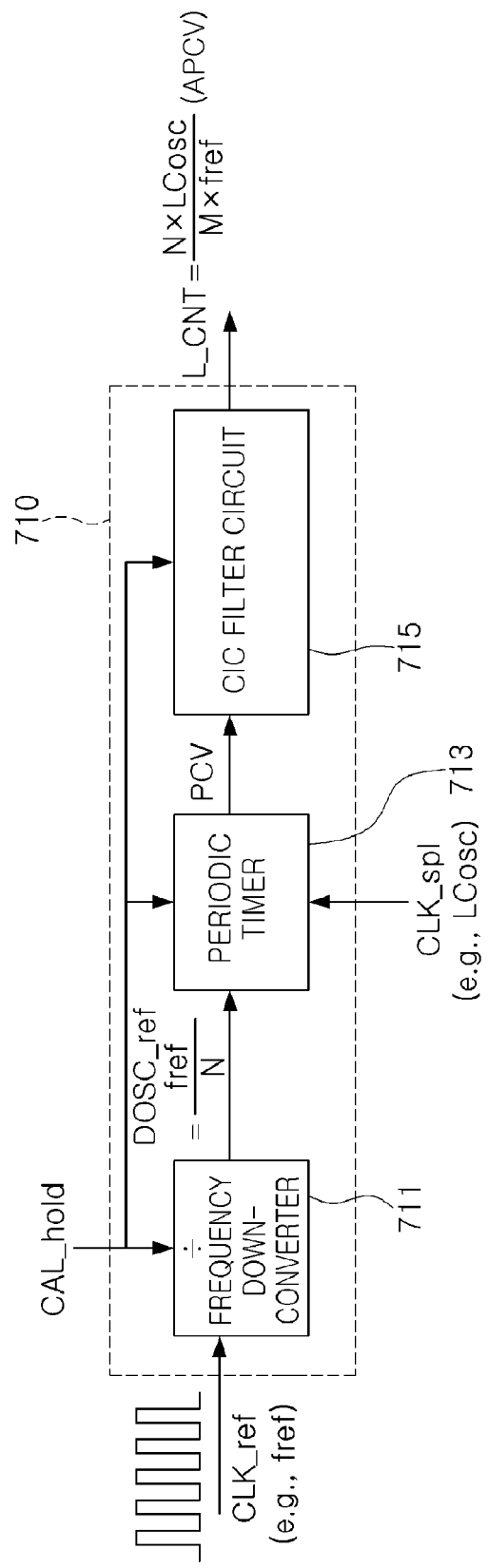
FIG. 18 is a block diagram of an example of a digital frequency counter.

Referring to FIG. 18, the digital frequency counter 710 divides a reference frequency signal fref, input as a reference clock signal CLK_ref, by a reference frequency division ratio N to generate a divided reference clock signal DOSC_ref, and counts the resonance signal LCosc based on the divided reference clock signal DOSC_ref to output a count value L_CNT.

Figure 23:
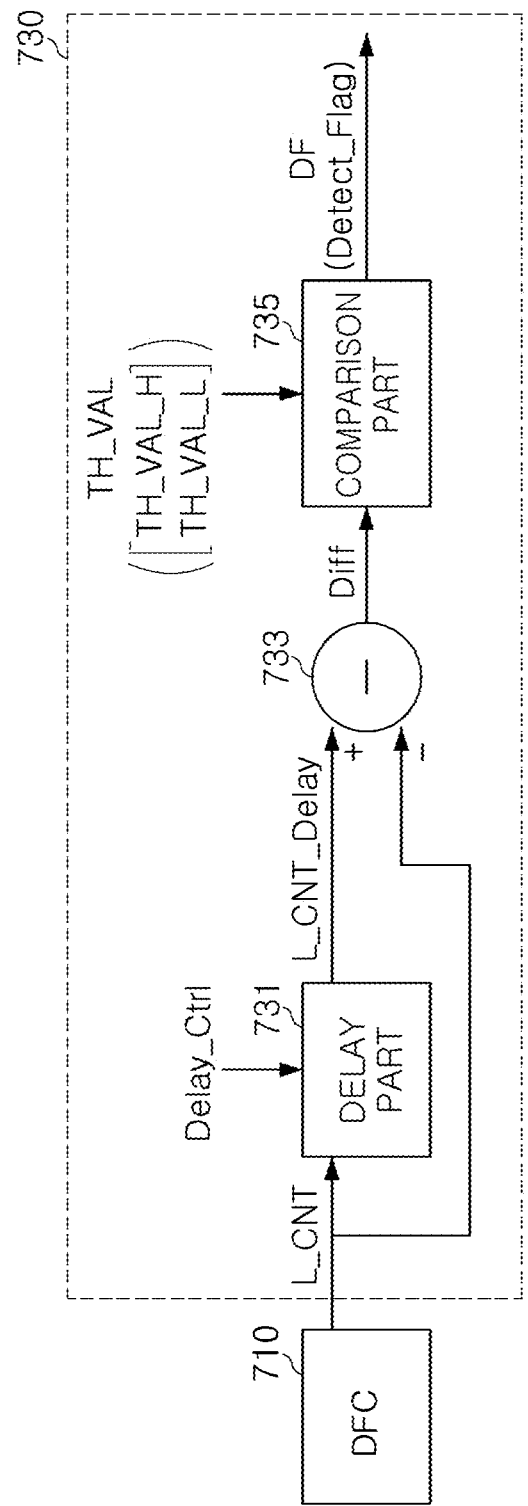
FIG. 23 is a block diagram of an example of a touch detector.

Referring to FIG. 23, the touch detector 730 takes a difference between the count value L_CNT, received from the digital frequency counter (DFC) 710, and a delayed count value L_CNT_Delay generated by the touch detector 730 to generate a difference value Diff, and compares the difference value Diff with a predetermined comparison value TH_VAL to output a touch detection signal DF (Detect_Flag) having a level for determining whether or not the resonant circuit 600 has been touched, based on a comparison result.

Figure 10:
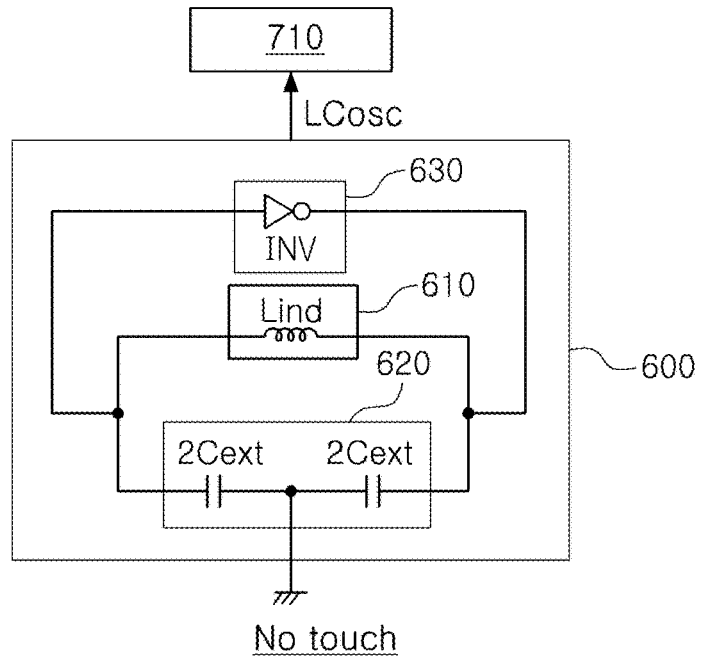
FIG. 10 is a circuit diagram of the resonant circuit in FIG. 9 when untouched.

FIG. 10 is a circuit diagram of the resonant circuit in FIG. 9 when a touch member is untouched.

Referring to FIG. 10, when a touch member (not shown) is untouched (there is no touch input), the inductance circuit 610 includes a first coil component 611A mounted on the substrate 200 disposed on an inner surface of the touch member and having an inductance Lind.

When untouched, the capacitance circuit 620 includes a capacitance element 620A, mounted on the substrate 200 and having a capacitance Cext (2Cext+2Cext), such as an MLCC or other type of capacitor. As an example, the capacitance Cext is illustrated as a serially connected circuit of two capacitances 2Cext+2Cext when expressed as an equivalent circuit.

FIG. 11 is a circuit diagram of the resonant circuit in FIG. 9 when a touch member is touched.

Referring to FIG. 11, when the touch member (not shown) is touched (when a touch input has occurred), the inductance circuit 610 includes a first coil element 611A mounted on the substrate 200 disposed on an inner surface of the first touch member TM1 and having an inductance Lind, as illustrated in FIG. 10.

When touched, the capacitance circuit 620 includes a capacitance element 620A mounted on the substrate 200 and having a capacitance Cext (2Cext+2Cext), as illustrated in FIG. 10. In addition to FIG. 1, the capacitance circuit 620 includes a touch capacitance Ctouch generated based on the touch of the touch member (not shown). The touch capacitance Ctouch is connected, in parallel, with one capacitance 2Cext among the capacitance 2Cext+2Cext of the capacitance element 620A.

The inverter circuit 630 includes at least one inverter INV to maintain a resonance signal.

Figure 12:
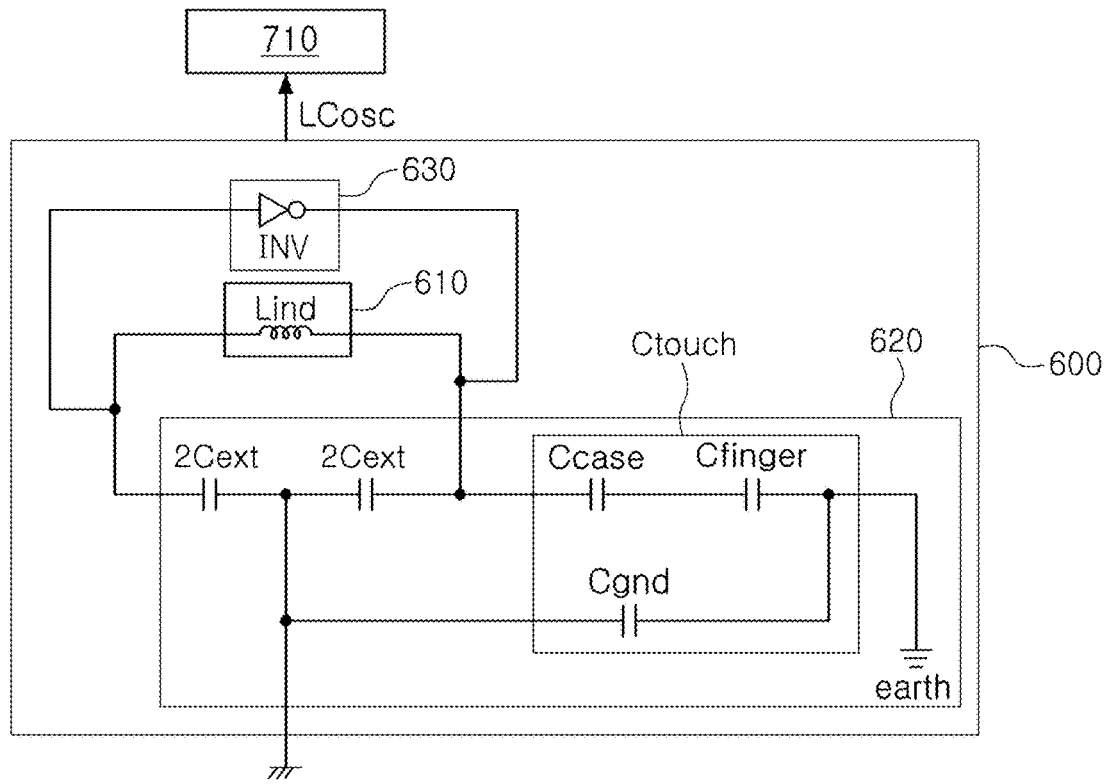
FIG. 12 is a circuit diagram of touch capacitance in FIG. 11.

FIG. 12 is a more detailed circuit diagram of the circuit diagram of FIG. 11 showing capacitances of the touch capacitance in FIG. 11.

Referring to FIG. 12, the touch capacitance Ctouch is connected, in parallel, with one capacitance 2Cext among the capacitance 2Cext+2Cext of the capacitance element 620A when touched, and includes a plurality of capacitances Ccase, Cfinger, and Cgnd connected to each other in series.

The capacitance Ccase is a case capacitance, the capacitance Cfinger is a finger capacitance, and the capacitance Cgnd is a ground capacitance between a circuit ground and earth.

Referring to FIG. 10, the resonant circuit 600 is a parallel resonant circuit including the inductance Lind of the first coil element 611A included in the inductance circuit 610, and the capacitance Cext (2Cext and 2Cext) of the capacitance element 620A included in the capacitance circuit 620.

A first resonant frequency fres1 of the resonant circuit 600 may be expressed by Equation 1 below.

$$fres1 \approx \frac{1}{2\pi\sqrt{(Lind * Cext)}} \quad (1)$$

In Equation 1, ≈ denotes sameness or similarity, and the term "similarity" means that other values may be further included. In other words, there may be other parameters affecting the first resonant frequency fres1 that may be included in Equation 1.

A resistor (not shown) may be connected between the first coil element 611A and the capacitance element 620A. The resistor may perform an electrostatic discharge (ESD) function.

As illustrated in FIGS. 10 and 11, when a touch has occurred, such as a finger touching a single touch switch, an overall capacitance is varied in the resonant circuit 600 when the touch capacitance Ctouch is added, as illustrated in FIG. 11.

Referring to FIGS. 11 and 12, the resonant circuit 600 includes the capacitance Cext (2Cext and 2Cext) of the capacitance element 620A, included in the capacitance circuit 620, as well as the touch capacitance Ctouch (Ccase, Cfinger, and Cgnd) formed when the touch member is touched.

Referring to FIG. 12, the touch capacitance Ctouch (Ccase, Cfinger, and Cgnd) includes the case capacitance Ccase and the finger capacitance Cfinger, connected to each other in series, and the ground capacitance Cgnd between the circuit ground and earth.

Accordingly, it will be understood that the overall capacitance of the resonant circuit 600 in FIG. 12 is variable as compared with the resonant circuit of FIG. 10.

For example, when the capacitance 2Cext and 2Cext are expressed by an equivalent circuit divided into one capacitance 2Cext and another capacitance 2Cext based on the circuit ground, the case capacitance Ccase, the finger capacitance Cfinger, and the ground capacitance Cgnd are connected with the one capacitance 2Cext or the other capacitance 2Cext in parallel.

When a touch has occurred, a second resonant frequency fres2 of the resonant circuit 600 may be expressed by Equation 2 below.

$$fres2 \approx \frac{1}{2\pi\sqrt{(Lind * [2Cext \| (2Cext + (CT)])}}$$

$$CT \approx Ccase \| Cfinger \| Cgnd$$

In Equation 2, ≈ denotes sameness or similarity, and the term "similarity" means that other values may be further included. In other words, there may be other parameters affecting the second resonant frequency fres2 that may be included in Equation 2. In Equation 2, the capacitance Ccase is a parasitic capacitance between the case (the cover) and the first coil element 611A, the capacitance Cfinger is a capacitance of a human body, and the capacitance Cgnd is a ground return capacitance circuit between the circuit ground and earth.

In Equation 2, "∥" is defined as follows: "a ∥ b" is defined as a serial connection between "a" and "b" in a circuit, and a sum value thereof is calculated as "(a*b)/(a+b)".

Comparing Equation 1 (when there is no touch) and Equation 2 (when a touch has occurred), the capacitance 2Cext of Equation 1 is increased to the capacitance 2Cext+ CT of Equation 2. Accordingly, it will be understood that the first resonant frequency fres1 when there is no touch is decreased to the second resonant frequency fres2 when a touch has occurred.

Returning to FIGS. 9 to 12, the resonant circuit 600 generates a resonance signal having a first resonant frequency fres1 when there is no touch or a resonance signal having a second resonant frequency fres2 when a touch has occurred, and outputs the generated signal to the digital frequency counter 710.

The digital frequency counter 710 converts a resonance signal LCosc having a first resonant frequency fres1 (when there is no touch input) or a second resonant frequency fres2 (when a touch input has occurred) into a digital value to generate a count value L_CNT corresponding to the resonant frequency and outputs the count value L_CNT to the touch detector 730.

The touch detector 730 detects a touch based on the count value L_CNT, which is the digital value input from the digital frequency counter 710.

In this application, the count value L_CNT is a digital value generated by a count processing operation performed by digital signal processing rather than analog signal processing. Therefore, the count value L_CNT cannot be generated by signal amplification performed by a simple analog amplifier, but is generated by a count processing operation performed by the digital frequency counter 710 disclosed in this application. Such a count processing operation may use a reference clock signal (for example, a reference frequency signal) and a sample clock signal (for example, a resonance signal), as will be described later.

Figure 13A:
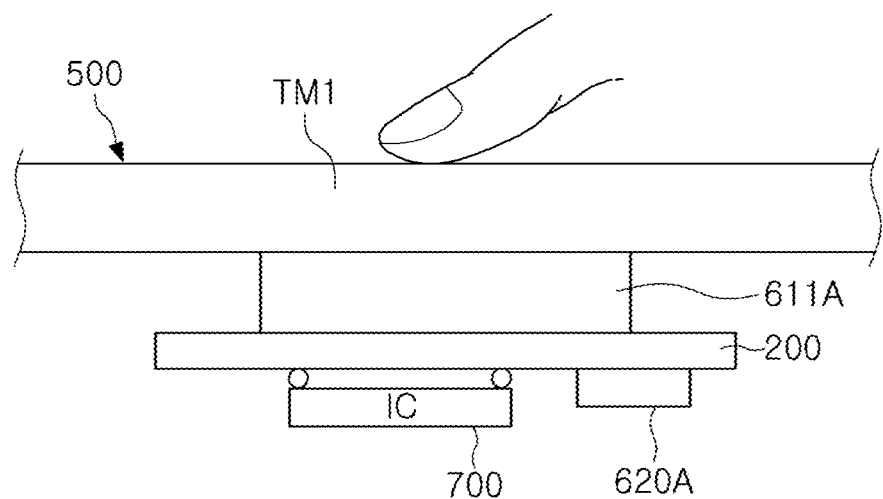
FIGS. 13A and 13B illustrate examples of a structure of a touch input sensing apparatus.
Figure 13B:
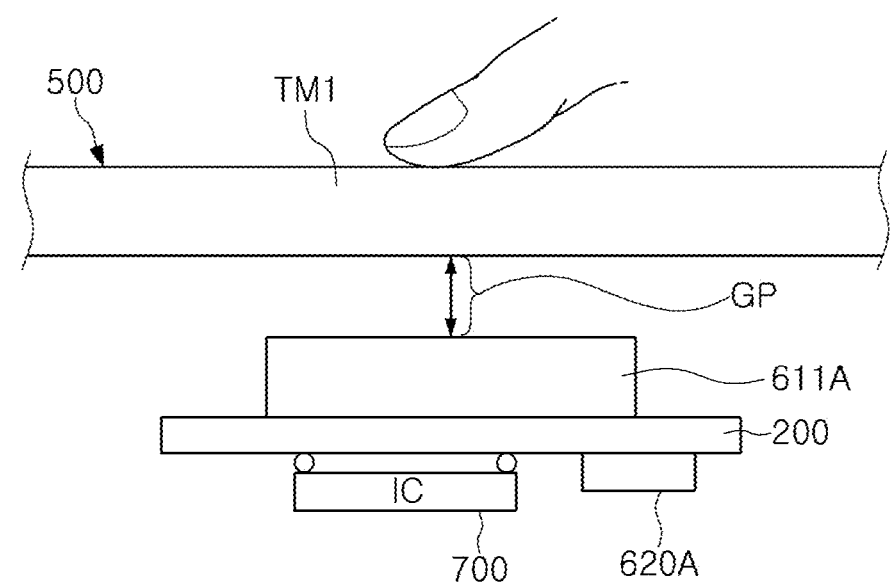

FIGS. 13A and 13B illustrate examples of a structure of a touch input sensing apparatus.

Referring to FIG. 13A, the first coil element 611A is attached to or is in contact with an inner surface of the first touch member TM1 of the housing 500.

For example, the first touch member TM1 may be aluminum or a metal if it is a conductor. The first touch member TM1 may be plastic if it is an insulator.

FIG. 13A illustrates a coil contact structure in which the first coil element 611A is in direct contact with the inner surface of the first touch member TM1. As an example, a ferromagnetic sheet (not shown), such as a ferrite sheet, may be disposed on a lower surface of the first coil element 611A. The ferrite sheet blocks noise and eddy currents flowing outwardly from the first coil element 611A, and concentrates a magnetic field to improve the inductance of the first coil element 611A.

In addition, the first coil element 611A is disposed on one surface of a substrate 200, and a circuit part 700 for sensing and a capacitance element 620A are disposed on the other surface of the substrate 200.

In the coil contact structure in which the first coil element 611A is in direct contact with the inner surface of the first touch member TM1 as illustrated in FIG. 13A, an improved touch sensing sensitivity, a small size, and a simple assembly operation are obtained, and sensing of a touch may be performed without deflection.

Referring to FIG. 13B, an inner surface of the first touch member TM1 of the housing 500 and the first coil element 611A are spaced apart from each other by a predetermined distance GP.

For example, the first coil element 611A may be sensed without deflecting the first coil element 611A. Since the first coil element 611A is spaced apart from the first touch member TM1, the first coil element 611A may be easily replaced when it fails. In addition, since the first touch member TM1 and the first coil element 611A are separated from each other, the first touch member TM1 and the first coil element 611A are insensitive to a temperature influence and are more resistant to electrostatic discharge (ESD).

Each of the first and second coil elements 611A and 612A may be an individual coil element such as a solenoid coil, a winding-type inductor, a PCB coil, a chip inductor, or other type of individual coil element, but is not limited thereto. The first and second coil elements 611A and 612A are not limited in shape, type, and manufacturing method, and may be any element as long as it has an inductance.

Figure 15A:
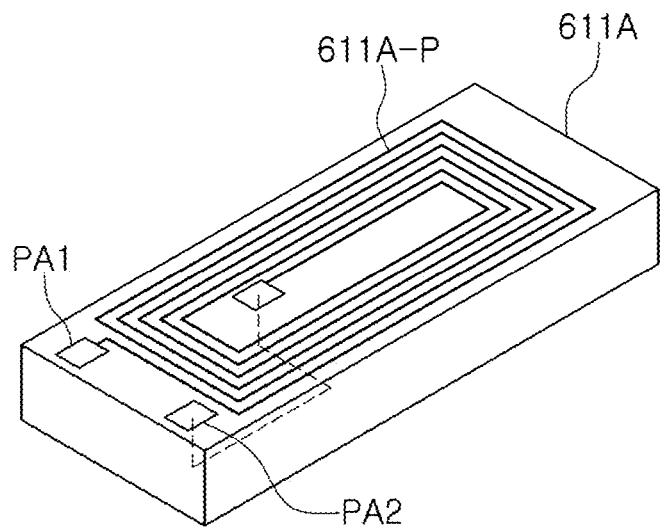
FIGS. 15A and 15B illustrate examples of a coil element.
Figure 15B:
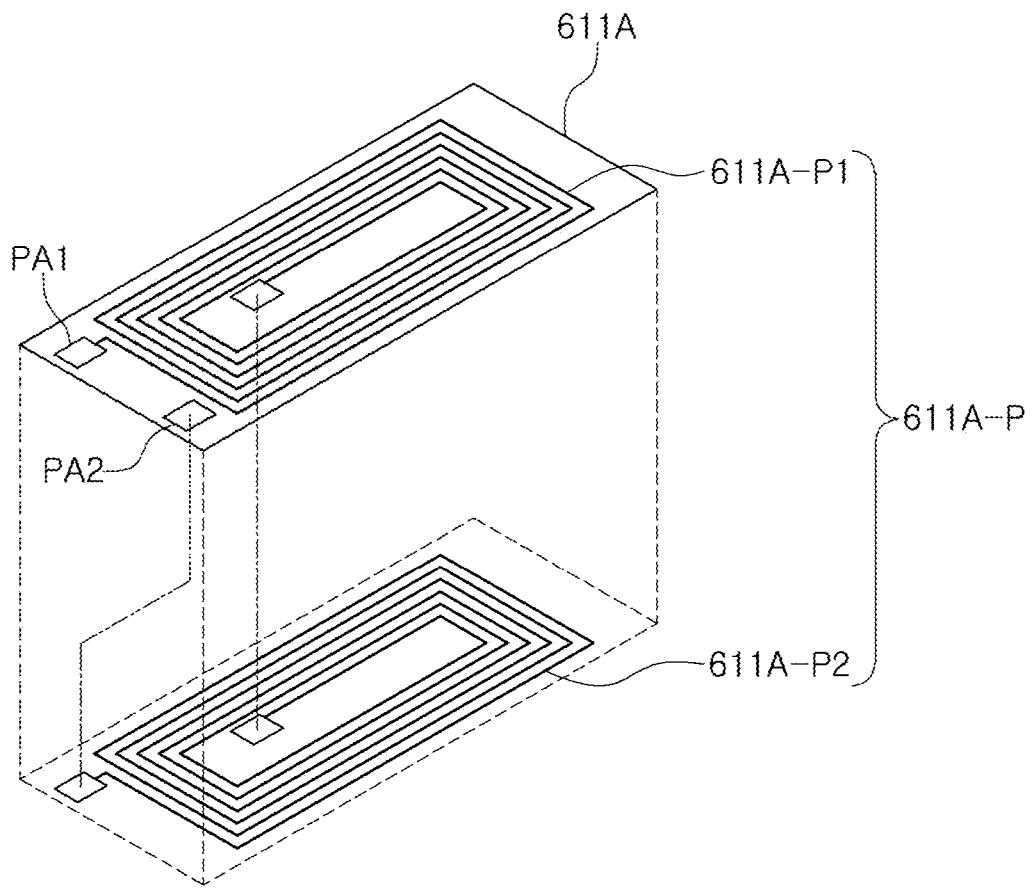

An example of the first coil element 611A among the first and second coil elements 611A and 612A will be described with reference to FIGS. 15A and 15B. The descriptions of FIGS. 15A and 15B are also applicable to the second coil element 612A.

Figure 14:
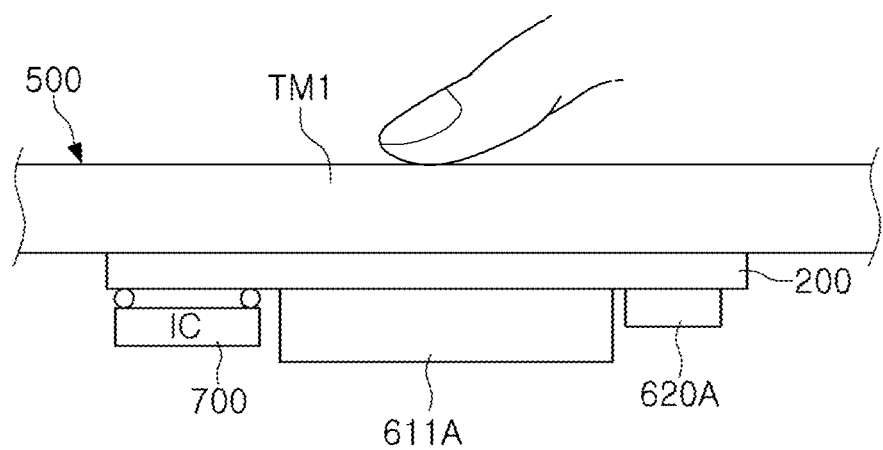
FIG. 14 illustrates another example of a structure of a touch input sensing apparatus.

FIG. 14 illustrates another example of a structure of a touch input sensing apparatus.

FIGS. 2 to 8B and 13A illustrate examples of a structure in which the coil element 611A is directly attached to the inner surface of the first touch member TM1.

In contrast, as illustrated in FIG. 14, one surface of a substrate 200 is directly attached to an inner surface of the first touch member TM1, and a coil element 611A, a circuit part 700, and a capacitance element 620A are disposed on the other surface of the substrate 200.

FIGS. 15A and 15B illustrate examples of a coil element.

Referring to FIGS. 15A and 15B, a first coil element 611A is a printed circuit board (PCB) coil element formed by a PCB pattern.

For example, the first coil element 611A includes a coil pattern 611A-P having a spiral shape connected between a first pad PA1 and a second pad PA2, and the coil pattern 611A-P is a PCB pattern.

In one example, referring to FIG. 15A, when a double-sided PCB having a first surface (for example, an upper surface) and a second surface (for example, a lower surface) is used, the first pad PA1 and the second pad PA2 are disposed on the first surface, the first pad PA1 is connected to an outer end of the coil pattern 611A-P on the first surface, and the second pad PA2 is connected to an inner end of the coil pattern 611A-P by vias extending from the first surface to the second surface and a circuit pattern on the second surface.

In another example, referring to FIG. 15B, when a double-sided PCB having a first surface (for example, an upper surface) and a second surface (for example, a lower surface) is used, a first pad PA1 and a second pad PA2 are disposed on the first surface, a first coil pattern 611A-P-1 is formed on the first surface, a second coil pattern 611A-P-2 is formed on the second surface, an inner end of the first coil pattern 611A-P-1 and an inner end of the second coil pattern 611A-P-2 are connected to each other by a via extending from the first surface to the second surface, an outer end of the first coil pattern 611A-P-1 is connected to the first pad PA1 on the first surface, and an outer end of the second coil pattern 611A-P-2 is connected to the second pad PA2 by another via extending from the first surface to the second surface.

For example, the first coil element 611A may be formed to have various shapes such as a circle, a triangle, a rectangle, and other shapes, but is not limited to a specific shape.

Although the first coil element 611A has been described with reference to FIGS. 15A and 15B, the second coil element 612A may have the same structure as the first coil element 611A.

Unlike the description of the double-sided PCB coil element in FIGS. 15A and 15B, either one or both of the first coil element 611A and the second coil element 612A may be implemented in a multilayer PCB having a plurality of layers. In this case, the first surface may be an upper surface of an uppermost layer of the multilayer PCB, and the second surface may be an upper surface of a lowermost layer of the multilayer PCB.

The examples of a double-sided PCB coil element illustrated in FIGS. 15A and 15B are just examples, and the PCB coil element is not limited thereto, but may be any PCB coil element as long as it is configured to provide inductance to a resonant circuit.

Figure 16:
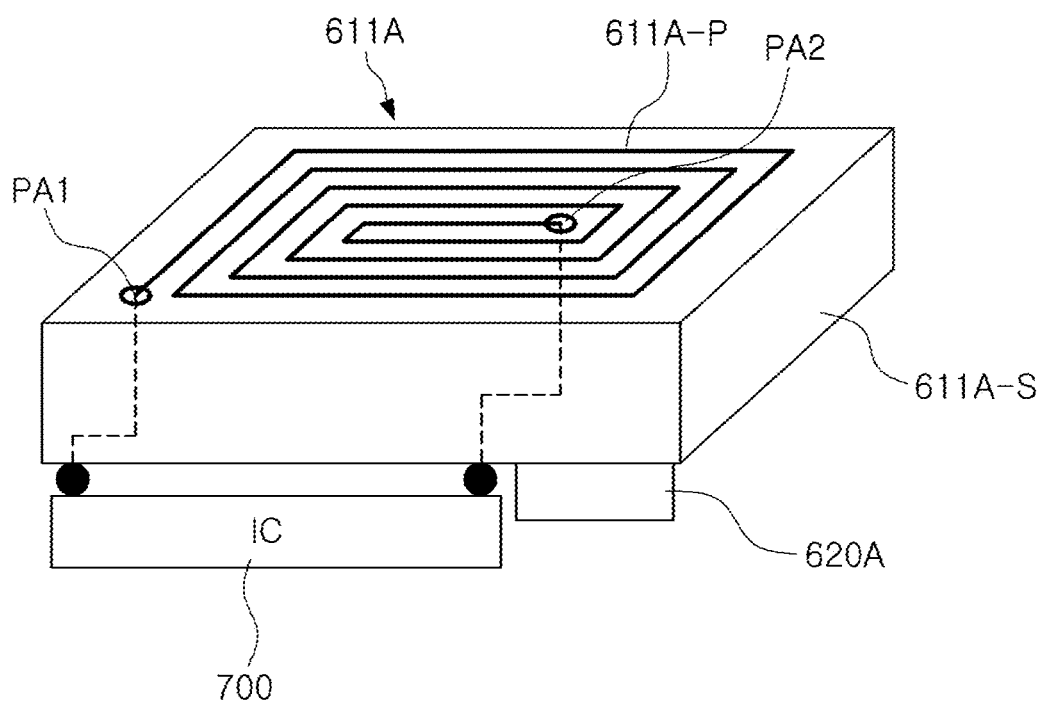
FIG. 16 illustrates an example of a coil element, an integrated circuit, and a capacitance element.

FIG. 16 illustrates an example of a coil element, an integrated circuit, and a capacitance element.

Referring to FIG. 16, the substrate 200 in the examples illustrated in FIGS. 2-8B, 13A, 13B, and 14 is omitted in this example.

The first coil element 611A includes a multilayer PCB substrate 611A-S having an uppermost surface facing a first touch member TM1 (in FIG. 2), and a lowermost surface opposing the uppermost surface.

The multilayer PCB substrate 611A-S includes a lowermost layer, at least one intermediate layer, and an uppermost layer. A lower surface of the lowermost layer is the lowermost surface of the multilayer PCB substrate 611A-S, and an upper surface of the uppermost layer is the uppermost surface of the multilayer PCB substrate 611A-S.

A PCB pattern 611A-P of the first coil element 611A is disposed on the uppermost surface of the multilayer PCB substrate 611A-S. The PCB pattern 611A-P is a PCB pattern having a spiral shape connected between a first pad PA1 and a second pad PA2 disposed on the uppermost surface of the multilayer PCB substrate 611A-S. The first pad PA1 and the second pad PA2 are electrically connected to the resonant circuit 600 (not shown) through the substrate 200.

A capacitance element 620A, such as an MLCC or other type of capacitance element, and a circuit part 700 are disposed on the lowermost surface of the multilayer PCB substrate 611A-S.

For example, the first coil element 611A includes a multilayer PCB substrate 611A-S and a PCB pattern 611A-P disposed on the multilayer PCB substrate 611A-S. The PCB pattern 611A-P is a PCB pattern having a spiral shape connected between the first pad PA1 and the second pad PA2 disposed on the multilayer PCB substrate 611A-S.

As an example, the PCB pattern 611A-P is disposed on the uppermost surface of the multilayer PCB substrate 611A-S, and a capacitance element 620A, such as an MLCC or other type of capacitance element, and the circuit part 700 are directly disposed on the lowermost surface of the multilayer PCB substrate 611A-S.

The circuit part 700, the capacitance element 620A, and the PCB pattern 611A-P are electrically connected to each other through the multilayer PCB substrate 611A-S.

Figure 17A:
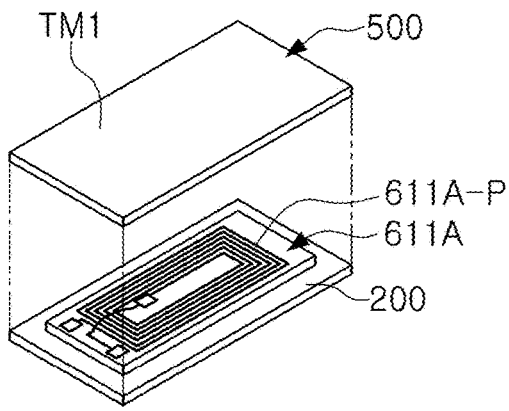
FIGS. 17A, 17B, and 17C illustrate examples of dispositions of a coil element in FIG. 2.
Figure 17B:
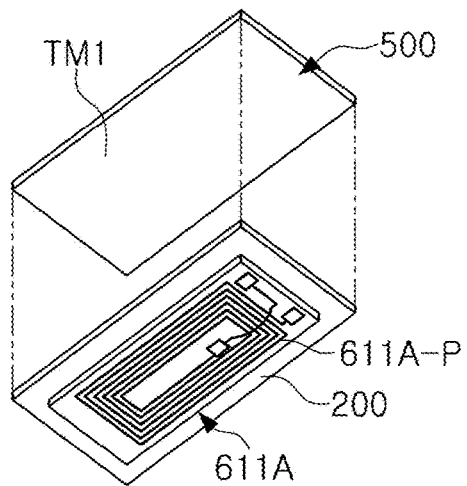
Figure 17C:
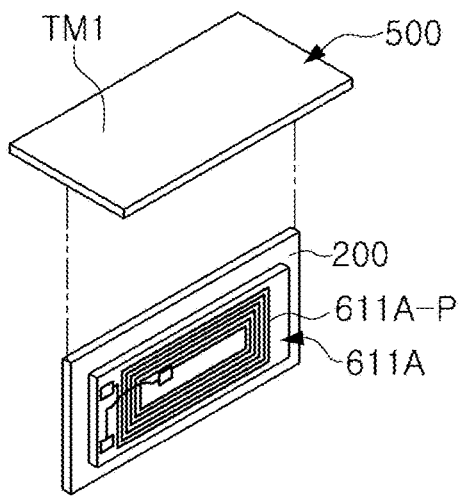

FIGS. 17A, 17B, and 17C illustrate examples of dispositions of a coil element in FIG. 2.

FIG. 17A illustrates an example of a disposition of the first coil element 611A in FIG. 2. Referring to FIG. 17A, a first coil element 611A is disposed on one surface of the substrate 200, facing a first touch member TM1, and a circuit part 700 and a capacitance element 620A (not shown) are disposed on the other surface of the substrate 200 opposing the one surface of the substrate 200. The one surface of the substrate 200, on which the first coil element 611A is disposed, is disposed parallel to an inner surface of the first touch member TM1 while facing the inner surface of the first touch member TM1.

For example, in a three-dimensional (x,y,z) coordinate system of FIGS. 17A, 17B, and 17C, an x axis is defined as a length direction of the first touch member TM1, a y axis is defined as a width direction of the first touch member TM1, and a z axis is defined as a direction perpendicular to the first touch member TM1.

In the three-dimensional coordinate system, the substrate 200 and the first touch member TM1 are disposed parallel to an x-y plane while being spaced apart from each other.

FIG. 17B illustrates another example of disposition of the first coil element 611A in FIG. 2. Referring to FIG. 17B, the first coil element 611A is disposed on the other surface of a substrate 200, opposing one surface of the substrate 200 facing a first touch member TM1, and a circuit part 700 and a capacitance element 620A (not shown) are disposed on the one surface. The other surface, on which the first coil element 611A is disposed, is disposed parallel to an inner surface of the first touch member TM1 while facing the inner surface of the first touch member TM1.

In a three-dimensional coordinate system, the substrate 200 and the first touch member TM1 are disposed parallel to an x-y plane while being spaced apart from each other.

FIG. 17C illustrates another example of a disposition of the first coil element 611A in FIG. 2. Referring to FIG. 17C, the first coil element 611A is disposed on one surface of the substrate 200, and a circuit part 700 and a capacitance element 620A (not shown) are disposed on the other surface of the substrate 200 opposing the one surface of the substrate 200. As an example, the substrate 200, on which the first coil element 611A is disposed, is disposed substantially perpendicular to the first touch member TM1, rather than parallel to the first touch member TM1 as it is in FIGS. 17A and 17B.

In a three-dimensional coordinate system, the first touch member TM1 is disposed parallel to an x-y plane the substrate 200 is disposed parallel to an x-z plane, and the substrate 200 and the first touch member TM1 are spaced apart from each other.

Referring to FIGS. 17A, 17B, and 17C, it will be understood that the substrate 200, on which the first coil element 611A is disposed, may be disposed in various ways with respect to the first touch member TM1. Therefore, the disposition of the substrate 200 is not limited to the examples illustrated in FIGS. 17A, 17B, and 17C, and the substrate 200 may be disposed in any manner as long as a resonant frequency is variable based on a change in capacitance caused by a touch of the touch member TM1.

FIG. 18 is a block diagram of an example of a digital frequency counter.

Referring to FIG. 18, the digital frequency counter 710 outputs a count value L_CNT, which is a digital value, generated by counting a resonance signal LCosc, input as a sample clock signal CLK_spl, based on a reference frequency signal fref, input as a reference clock signal CLK_ref.

When the resonance signal LCosc is counted based on the reference frequency signal fref, a frequency of the reference frequency signal fref does not need to be high. Therefore, a design may be easy and implementation costs may be reduced.

In one example, the digital frequency counter 710 divides the reference frequency signal fref by a reference frequency division ratio N to obtain a divided reference clock signal DOSC_ref, and counts the resonance signal LCosc based on the divided reference clock signal DOSC_ref to output the count value L_CNT.

In another example, the digital frequency counter 710 divides the reference frequency signal fref by a reference frequency division ratio N, divides the resonance signal LCosc from the resonant circuit 600 by a sensing frequency division ratio M, and counts the divided resonance signal LCosc/M based on the divided reference clock signal fref/N to output the count value L_CNT.

For example, the digital frequency counter 710 includes a frequency down-converter 711, a periodic timer 713, and a cascaded integrator-comb (CIC) filter circuit 715.

The frequency down-converter 711 receives a predetermined reference frequency signal fref as a reference clock signal CLK_ref, and divides the reference clock signal CLK_ref by a predetermined reference frequency division ratio N to down-convert a frequency of the reference frequency signal fref to obtain a divided reference clock signal DOSC_ref.

The periodic timer 713 receives the resonance signal LCosc as a sample clock signal CLK_spl, and outputs a periodic count value PCV generated by counting the resonance signal LCosc, received as the sample clock signal CLK_spl, during one time period of the divided reference clock signal DOSC_ref, received from the frequency down-converter 711.

The CIC filter circuit 715 outputs the count value L_CNT generated by performing cumulative amplification of the periodic count value PCV input from the periodic timer 713. Thus, the count value L_CNT is a cumulatively amplified periodic count value APCV.

Another example will be described with reference to FIG. 18. The digital frequency counter 710 outputs a count value L_CNT, which is a digital value generated by counting a reference frequency signal fref based on a resonance signal LCosc from the resonant circuit 600.

As an example, the digital frequency counter 710 divides a resonance signal LCosc by a predetermined sensing frequency division ratio M to obtain a divided reference clock DOSC_ref=LCosc/M, and counts the reference frequency signal fref based on the divided reference clock DOSC_ref=LCosc/M to output the count value L_CNT.

For example, the frequency down-converter 711 receives the resonance signal LCosc as a reference clock signal CLK_ref, and divides the reference clock signal CLK_ref by a predetermined sensing frequency division ratio M to down-convert a frequency of the reference clock signal CLK_ref to obtain the divided reference clock signal DOSC_ref=LCosc/M.

The periodic timer 713 receives a predetermined reference frequency signal fref as a sample clock signal CLK_spl, and outputs a periodic count value PCV generated by counting the predetermined reference frequency signal fref, received as the sample clock signal CLK_spl, during one time period of the divided reference clock signal DOSC_ref, received from the frequency down-converter 711.

The CIC filter circuit 715 performs cumulative amplification of the periodic count value PCV, received from the cycle timer 713, to output the count value L_CNT. As an example, the CIC filter circuit 715 is a decimator CIC filter. Another word for "decimator" is "downsampler."

Figure 19:
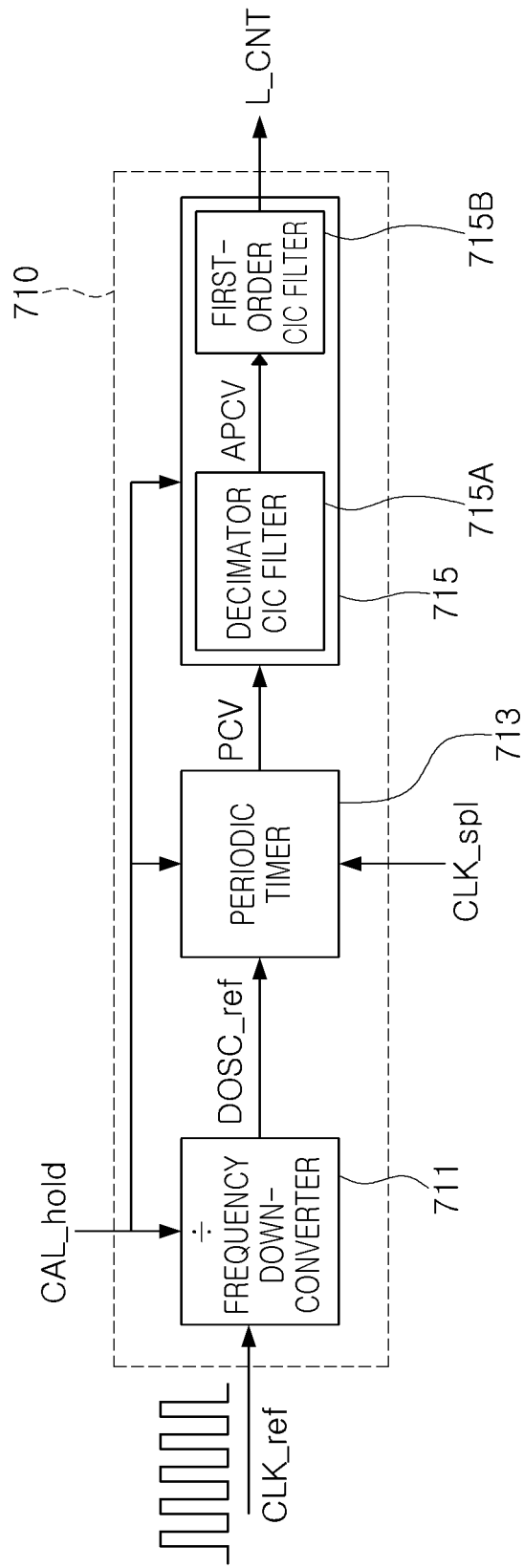
FIG. 19 is block diagram of another example of a digital frequency counter.

FIG. 19 is a block diagram of another example of a digital frequency counter.

Referring to FIG. 19, a CIC filter circuit 715 of FIG. 19 is different from the CIC filter circuit 715 of FIG. 18. In particular, the CIC filter circuit 715 of FIG. 19 includes a decimator CIC filter 715A and a first-order CIC filter 715b.

The decimator CIC filter 715A performs cumulative amplification of the periodic count value PCV received from the periodic timer 713.

The first-order CIC filter 715b calculates a moving average of an output value from the decimator CIC filter 715A to output a count value L_CNT in which noise in the output value from the decimator CIC filter 715A has been removed.

As an example, the decimator CIC filter 715A cumulatively amplifies the periodic count value PCV from the periodic timer 713 by a cumulative gain determined based on a predetermined integrating stage number SN, a predetermined decimator factor R, and a predetermined comb differential delay M, and outputs a cumulatively amplified periodic count value APCV.

In one example, the decimator CIC filter 715A is a fourth-order 4-decimator CIC filter in which the integrating stage number SN is 4, the decimator factor R is 4, and the comb differential delay M is 1.

In this application, the cumulative amplification is distinguished from amplification performed by a conventional analog amplifier, and is construed as digital amplification of an small digital input value to a relatively large digital output value.

Referring to FIGS. 18 and 19, the frequency down-converter 711 down-converts a frequency of a reference clock signal CLK_ref, which is either a reference frequency signal fref, or a resonance signal LCosc.

In one example, when the reference clock signal CLK_ref is the reference frequency signal fref, a divided reference clock signal DOSC_ref, output from the frequency down-converter 711, is an N-divided reference frequency signal fref/N, so that a frequency of the reference frequency signal fref is down-converted. In this case, N may be preset externally.

In another example, when the reference clock signal CLK_ref is the resonance signal LCosc, a divided reference clock signal DOSC_ref, output from the frequency down-converter 711, is an M-divided resonance signal LCosc/M, so that a frequency of the resonance signal LCosc is down-converted. In this case, M may be preset externally.

Referring to FIGS. 18 and 19, the digital frequency counter 710 is configured to perform a CAL_hold function by enabling or stopping the operation of the digital frequency counter 710. For example, when CAL_hold=0, the digital frequency counter 710 operates and updates the count value L_CNT, which is a sensing signal, and when CAL_hold=1, the digital frequency counter 710 stops operating and stops updating the count value L_CNT.

More specifically, when CAL_hold=1, the frequency down-converter 711 and the periodic timer 713 are reset by respectively setting an output DOSC_ref and a periodic count value PCV to zero, and the CIC filter 715 stops operating and holds the count value L_CNT until CAL_hold=0.

As described above, when CAL_hold=1, the operation of the digital frequency counter 710 is stopped. Thus, a power saving function is performed.

Figure 20:
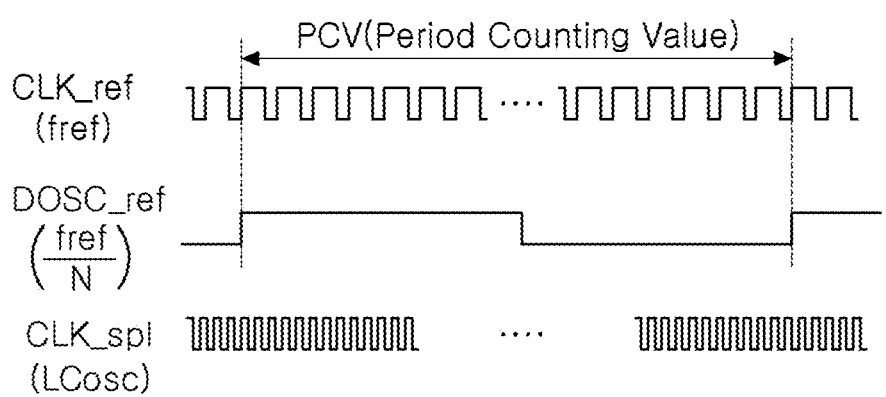
FIG. 20 illustrates an example of an operation of a periodic timer.

FIG. 20 illustrates an example of an operation of a periodic timer.

Referring to FIG. 20, CLK_ref is a reference clock signal, which may be a reference frequency signal fref or a resonance signal LCosc. The reference frequency signal fref may be generated by an external crystal, and it may be an oscillation signal in a phase-locked loop (PLL) or a resistor-capacitor (RC) timing circuit in an IC.

In one example, when the reference clock signal CLK_ref is the reference frequency signal fref, a sample clock signal CLK_spl is the resonance signal LCosc. In another example, when the reference clock signal CLK_ref is the resonance signal LCosc, the sample clock signal CLK_spl is the reference frequency signal fref. Alternatively, in other examples, a divided reference clock signal DOSC_ref may be fref/N or LCosc/M.

Figure 21:
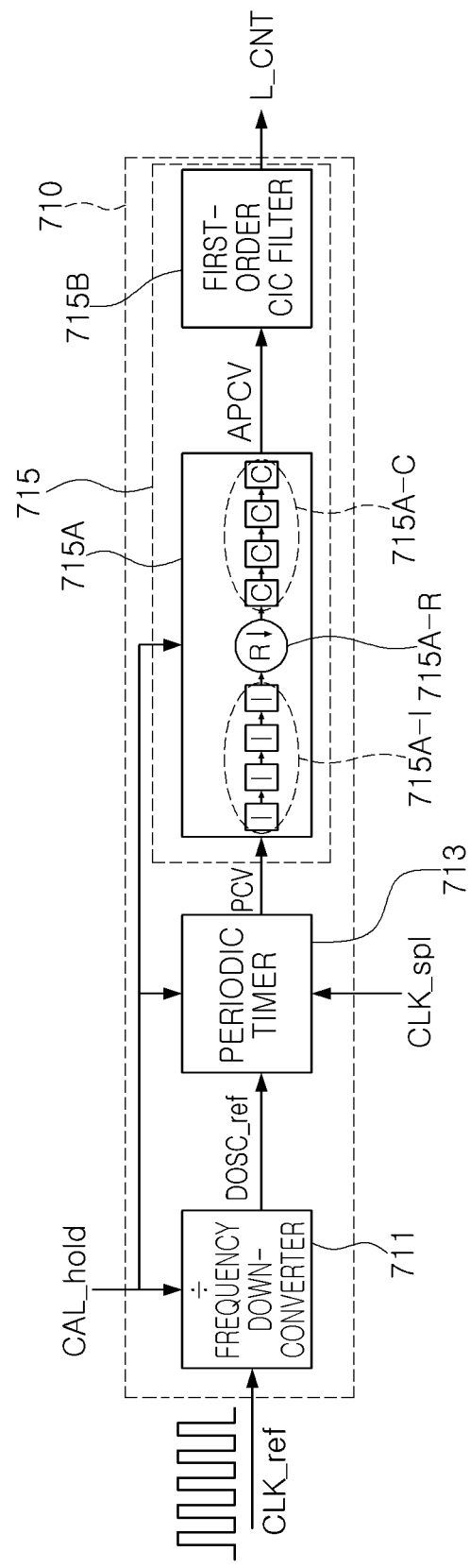
FIG. 21 is a block diagram of an example of a decimator cascaded integrator-comb (CIC) filter.

FIG. 21 is a block diagram of an example of a decimator CIC filter.

Referring to FIG. 21, a decimator CIC filter 715A of FIG. 21 is different from the decimator CIC filter 715A of FIG. 19.

As an example, the decimator CIC filter 715A receives a periodic count value PCV from a periodic timer 713.

As an example, the decimator CIC filter 715A is illustrated as the above-mentioned fourth-order 4-decimator CIC filter. However, since this is just an example, the integrating stage number SN, the decimator factor R, and the comb differential delay M are not limited to the values shown in FIG. 21. Rather, the decimator CIC filter circuit 715A may have an integrating stage number SN, a decimator factor R, and a comb differential delay M that are different from the values illustrated in FIG. 21.

As an example, the decimator CIC filter 715A cumulatively amplifies the periodic count value PCV from the periodic timer 713 by a cumulative gain, determined based on the integrating stage number SN, the decimator factor R, and the comb differential delay M, to output a cumulatively amplified periodic count value APCV.

In another example, as illustrated in FIG. 18, the cumulatively amplified periodic count value APCV may be provided as a count value L_CNT, which is a sensing signal, when a first-order CIC filter 7156 as shown in FIGS. 19 and 21 is not provided.

Referring to FIG. 21, the decimator CIC filter 715A includes an integrator circuit 715A-I, a decimator 715A-R, and a comb or differentiator circuit 715A-C.

The integrator circuit 715A-I includes a plurality of cascaded integrators I equal in number to the integrating stage number SN, and thus sequentially accumulates a periodic count value PCV from the periodic timer 713 to provide a cumulative value for each period of the divided reference clock signal DOSC_ref.

The decimator 715A-R samples one cumulative value of cumulative values of a number of periods from the integrator circuit 715A-I corresponding to the decimator factor R to provide a down-sampled cumulative value. For example, for R=4, the decimator 715A-R samples one cumulative value of cumulative values of 4 periods from the integrator circuit 715A-1 corresponding to the decimator factor R=4. In other words, the decimator 715A-R samples every fourth cumulative value from the decimator 715A-R.

The comb or differentiator circuit 715A-C includes a plurality of cascaded combs or differentiators C equal in number to the integrating stage number SN, and subtracts a current down-sampled cumulative value from the decimator 715A-R from a previous down-sampled cumulative value to provide a subtracted cumulative value for each period corresponding to the decimator factor R.

In one example, the decimator CIC filter 715A is a fourth-order 4-decimator CIC filter in which the integrating stage number SN is 4, the decimator factor R is 4, and the comb differential delay M is 1.

In another example, the decimator CIC filter 715A is a third-order 3-decimator CIC filter in which the integrating stage number SN is 3, the decimator factor R is 3, and the comb differential delay M is 1.

As described above, various decimator CIC filters may be implemented by changing the integrating stage number SN, the decimator factor R, and the comb differential delay M.

Returning to FIG. 21, in the decimator CIC filter 715A, a cumulative gain GAIN is $(R*M)^{SN}=(4*1)^4=4^4=256$. However, the integrating stage number SN=4, the decimator factor R=4, and the comb differential delay M=1 are just examples, and are not limited thereto.

As an example, the integrator circuit 715A-I includes four integrators I to sequentially accumulate a periodic count value PCV from the periodic timer 713 together with a four-period delayed periodic count value and provide a cumulative value for each period of the divided reference clock signal DOSC_ref.

Since the decimator 715A-R samples one of the cumulative values of four periods corresponding to the decimator factor (R=4) among the cumulative values from the integrator circuit 715A-I, the decimator 715A-R provides a ¼ down-sampled cumulative value. For example, the comb or differentiator circuit 715A-C includes four combs or differentiators C.

For example, in the decimator CIC filter 715A, as described above, when the periodic count value PCV is 49 and the cumulative gain GAIN is 256, a cumulatively amplified periodic count value APCV is 49*256=12544, obtained by multiplying 49, the periodic count value PCV, by 256, the cumulative gain GAIN.

By cumulatively amplifying the periodic count value PCV by the cumulative gain GAIN, the decimator CIC filter 715A obtains the same effect as counting a sample clock signal CLK_spl (either a resonance signal LCosc or a reference frequency signal fref) having a much higher frequency.

Figure 22:
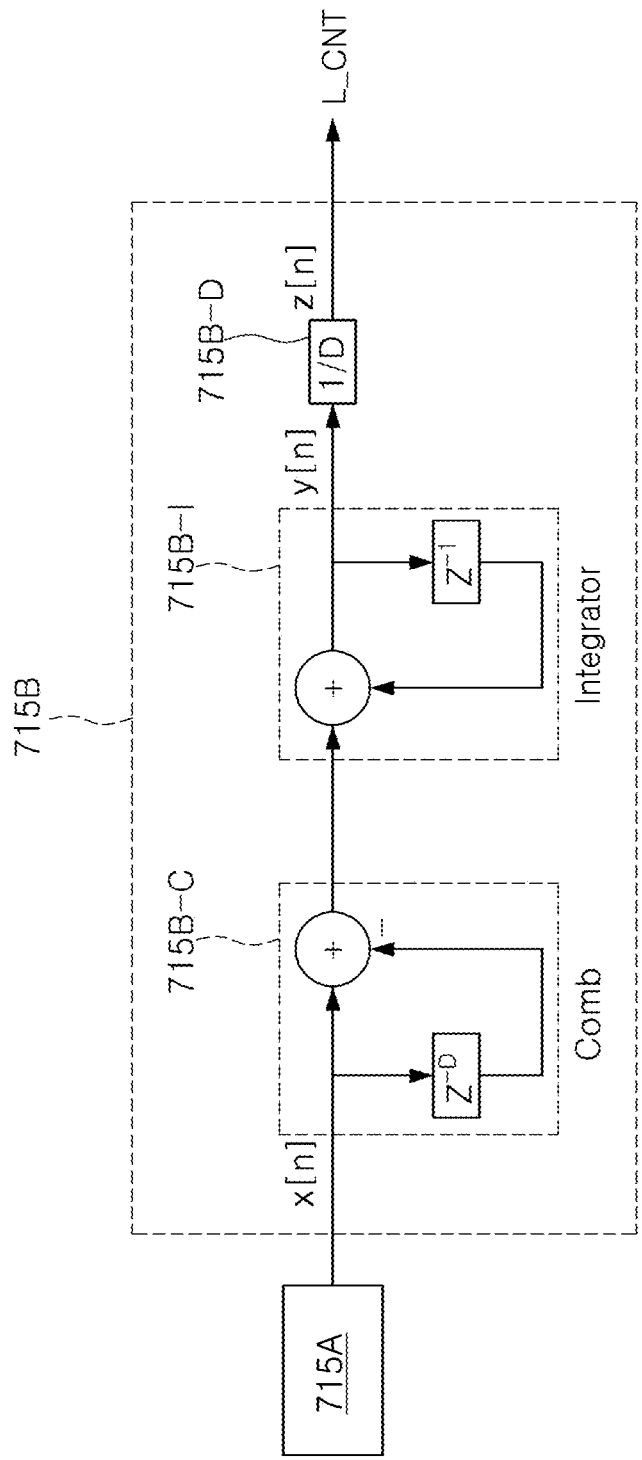
FIG. 22 is a circuit diagram of an example of a first-order CIC filter.

FIG. 22 is a circuit diagram of an example of a first-order CIC filter.

Referring to FIG. 22, as an example, when the first-order CIC filter 715B connected to the output of the decimator CIC filter 715A includes a 16 moving average filter, a moving average value is obtained for 16 units of an output value (a periodic count value) from the decimator CIC filter 715A to provide a moving average value of the periodic count value as a count value L_CNT.

When the first-order CIC filter 715B includes a D moving average filter, a count value L_CNT output from the first-order CIC filter 715B may be obtained according to Equation 3 below.

$$y[n]=x[n]-x[n-D]+y[n-1]$$

$$z[n]=y[n]/D \quad (3)$$

In Equation 3, n=0, 1, 2, and 3, x[n] is an amplified periodic count value APCV, z[n] is a count value L_CNT, i.e., a sensing signal, and D denotes a moving average length.

Referring to FIG. 22, as an example, a first-order CIC filter 715B includes a comb or differentiator 715B-C, an integrator 715B-I, and a divider 715B-D.

As an example, a difference x[n]-x[n-D] between an input x[n] and a delayed input x[n-D] corresponding to the moving average length D is obtained in the comb or differentiator 715B-C, and is accumulated with previous values of x[n]-x[n-D] in the integrator 715B-I. For example, a moving sum is performed for a value corresponding to the moving average length D to output y[n]. The output y[n] is divided by D in the divider 715B-D to obtain a count value L_CNT corresponding to a moving average value, for example, a count value L_CNT is provided. In this case, the moving average value length D (for example, 16) may be preset.

For example, the first-order CIC filter 715B obtains an average D while performing a moving sum of D (for example, 16) data for an output value of the decimator CIC filter 715A. Thus, the first-order CIC filter 715B serves to stabilize jitter of a frequency measured value.

As an example, the first-order CIC filter 715B may be a half-band digital filter.

FIG. 23 is a block diagram of an example of a touch detector.

Referring to FIG. 23, the touch detector 730 obtains a difference between the count value L_CNT, received from the digital frequency counter 710, and a delayed count value L_CNT_Delay to generate a difference value Diff, and compares the difference value Diff with a predetermined comparison value TH_VAL to output a touch detection signal DF (Detect_Flag) having a level indicating whether a touch has occurred, based on a comparison result.

For example, the touch detector 730 includes a delay part 731, a subtraction part 733, and a comparison part 735.

The delay part 731 delays the count value L_CNT, received from the digital frequency counter 710, by a delay time determined based on a delay control signal Delay_Ctrl to output a delayed count value L_CNT_Delay.

The subtraction part 733 differentiates the count value L_CNT to generate a difference value Diff by subtracting the count value L_CNT from the delayed count value L_CNT_Delay, received from the delay part 731. As an example, the subtraction part 733 includes at least one subtractor. For example, the count value L_CNT is a current count value, and the delayed count value L_CNT_Delay is a previous count value counted a predetermined delay time before a current time.

The comparison part 735 compares the difference value Diff, received from the subtraction part 733, with a predetermined comparison value TH_VAL to output the touch detection signal DF (Detect_Flag) having a high level or a low level determined based on the comparison result.

In one example, the comparison part 735 compares the difference value Diff, received from the subtraction part 733, with the comparison value TH_VAL. When the difference value is greater than the comparison value, the comparison part 735 outputs a high-level touch detection signal DF (Detect_Flag). When the difference is less than or equal to the comparison value TH_VAL, the comparison part 735 outputs a low-level touch detection signal DF (Detect_Flag). The comparison part 735 includes at least one comparator.

In another example, the comparison part 735 may have a hysteresis characteristic provided by an upper limit comparison value TH_VAL_H and a lower limit comparison value TH_VAL_L. The comparison part 735 compares the difference value Diff with the upper limit comparison value TH_VAL_H to determine whether to switch the touch detection signal DF (Detect_Flag) from a low level to a high level. The upper limit comparison value TH_VAL_H is equal to a first predetermined fraction (for example, ⅛) of an overall range, i.e., a maximum value, of the difference value Diff. The comparison part 735 compares the difference value Diff with the lower limit comparison value TH_VAL_L to determine whether to switch the touch detection signal DF (Detect_Flag) from the high level to the low level. The lower limit comparison value TH_VAL_L is equal to a second predetermined fraction (for example, 1/16) of the overall range, i.e., the maximum value, of the difference value Diff, and is less than the upper limit comparison value TH_VAL_H.

The description with reference to FIG. 23 is a description of a process of detecting a touch, based on a difference value with respect to the count value L_CNT, to output a touch detection signal DF (Detect Flag).

As an example, assume the count value L_CNT is 3639000 when the touch member is untouched. In this example, by setting a reference value to 3637500, a touch may be recognized when the count value L_CNT decreases to be less than or equal to the reference value 3637500 when the touch member is touched.

However, a degree of temperature change varies depending on a type of a touch member. The temperature change causes a drift of the count value L_CNT. In detail, when the touch member is made of a metal, the drift of the count value L_CNT occurs due to the temperature change caused by an external temperature and a touch of the touch member. Thus, the count value may be reduced to be less than or equal to the reference value even when the touch member has not been touched, or may not be reduced to be less than or equal to the reference value even when the touch member has been touched. In this case, since the drift of the count value L_CNT, caused by the temperature change, slowly changes over a long period of time, a touch that has occurred may not be recognized as a touch, or a touch may be recognized even when a touch has not occurred.

To address the above issue, a slope detection method of detecting a variation in the count value L_CNT, when touched, to recognize a touch may be used in an example.

Such a slope detection method is a method of recognizing a touch when a difference between a delayed count value L_CNT_Delay of a predetermined past time and a current count value L_CNT is greater than a predetermined value.

In this application, at least one of the above-mentioned slope detection method and the above-mentioned simple reference value comparison method (a method of recognizing a touch when a count value L_CNT is reduced to be less than or equal to a preset reference value) may be used.

Figure 24:
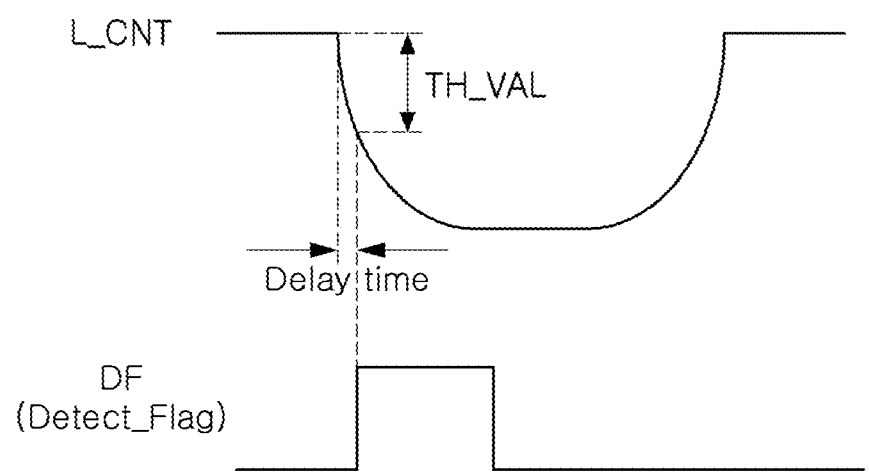
FIG. 24 illustrates an example of main signals of the touch detector in FIG. 23.

FIG. 24 illustrates an example of main signals of the touch detector in FIG. 23.

Referring to FIGS. 23 and 24, when the first touch member (TM1 in FIG. 2) is touched, a capacitance is increased, a frequency of a resonance signal LCosc is decreased, and a count value L_CNT is decreased, as described with respect to FIG. 12. A touch detection signal DF (Detect_Flag) having a high level is output when a difference between a delayed count value L_CNT_Delay and a current count value L_CNT is greater than or equal to a predefined comparison value TH_VAL.

In one example, in a method of switching a touch detection signal DF (Detect_Flag) from a high level to a low level, the touch detection signal DF (Detect_Flag) is switched from a high level to a low level when a difference between a delayed count value L_CNT_Delay and a current count value L_CNT is reduced to be less than or equal to a comparison value TH_VAL.

In another example, when the touch detection signal DF (Detect_Flag) is switched from a low level to a high level, a delayed count value L_CNT_Delay is stored. The stored delayed count value L_CNT_Delay and a current count value L_CNT are compared with each other. When a difference between the stored delayed count value L_CNT_Delay and the current count value L_CNT is less than or equal to a hysteresis value, it is determined that a touch input is finished, and the touch detection signal DF (Detect_Flag) is switched from the high level to the low level.

Figure 25:
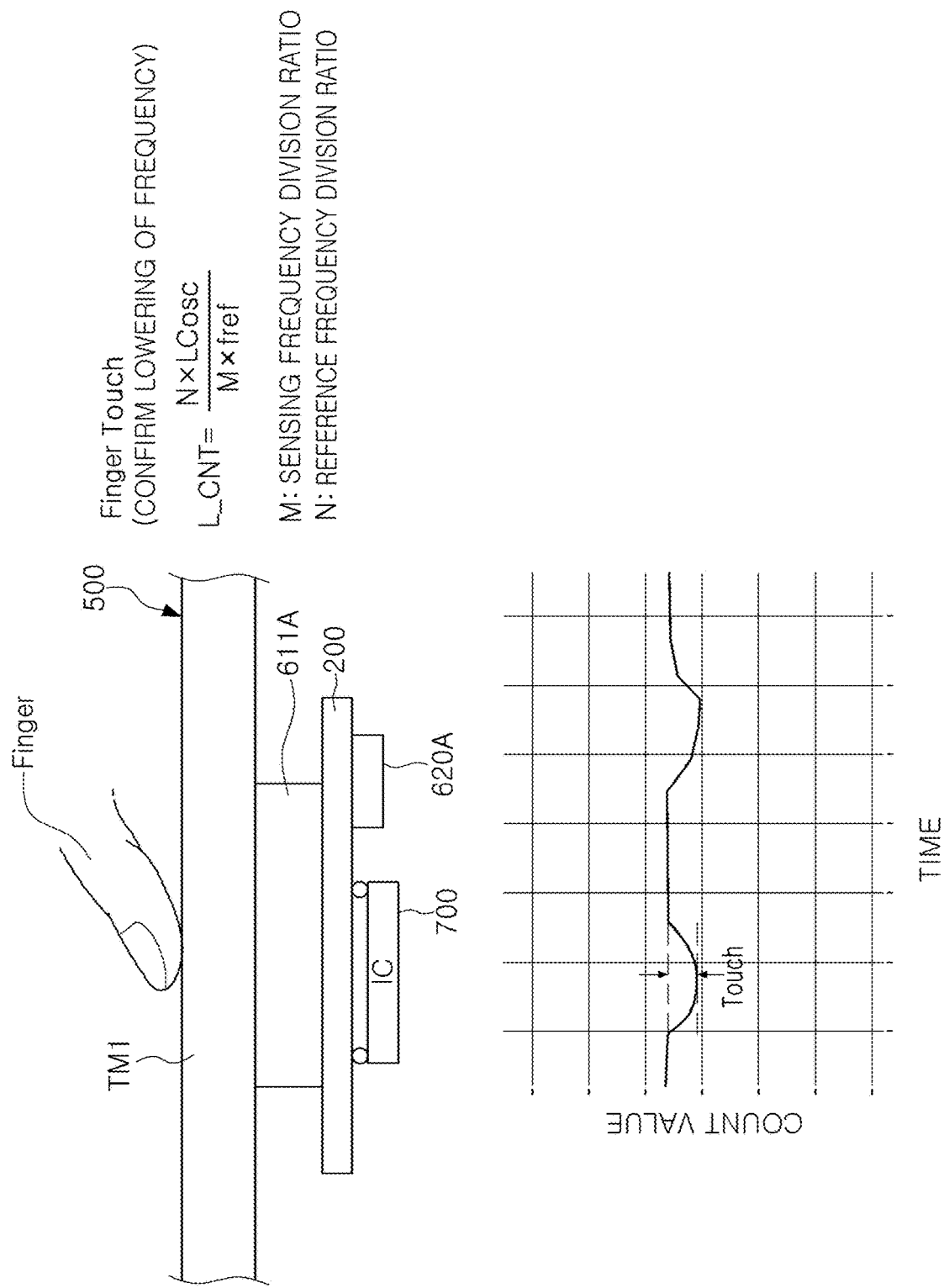
FIG. 25 illustrates an example of a count value when a touch member is touched by a finger.
Figure 26:
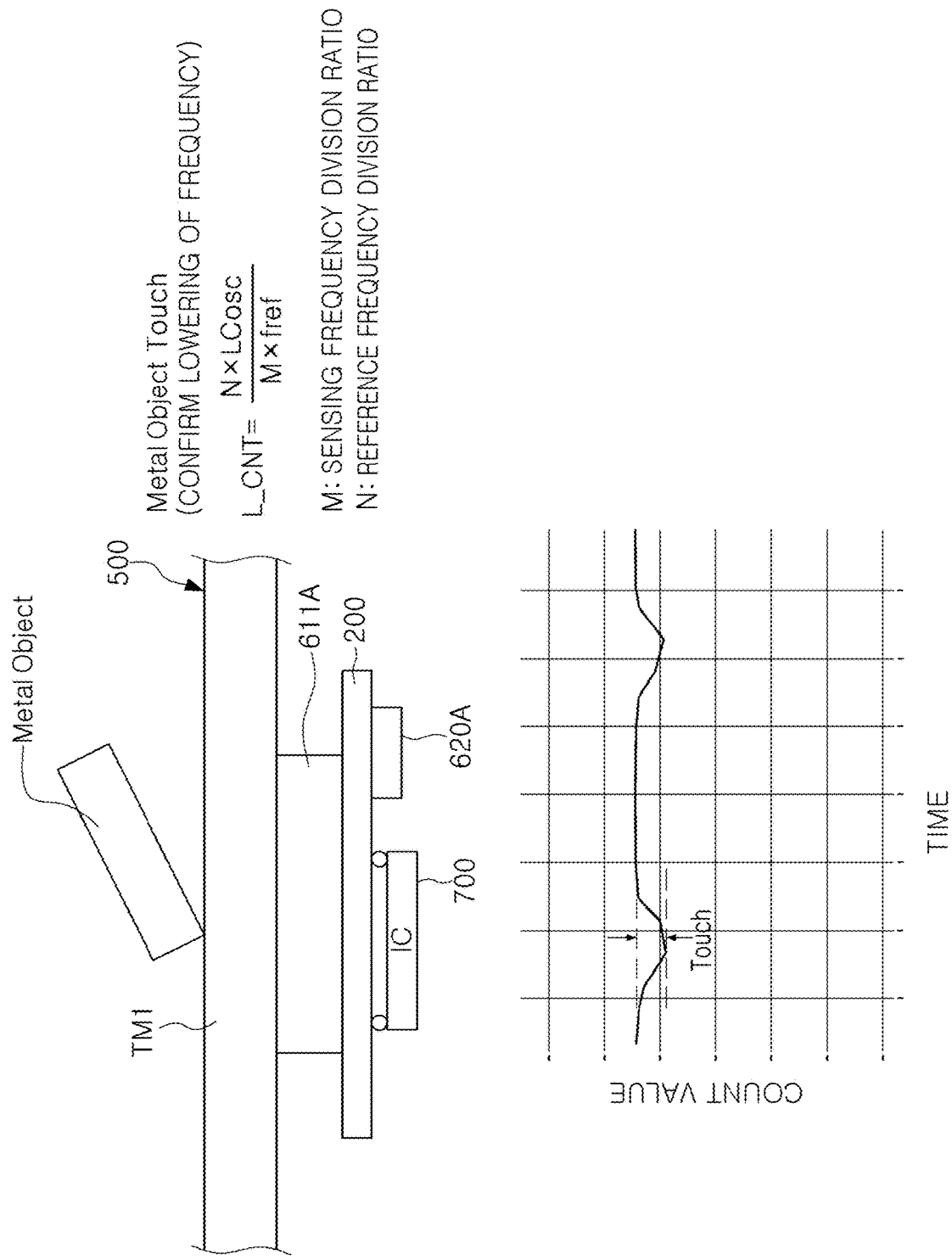
FIG. 26 illustrates an example of a count value when a touch member is touched by a metal object.
Figure 27:
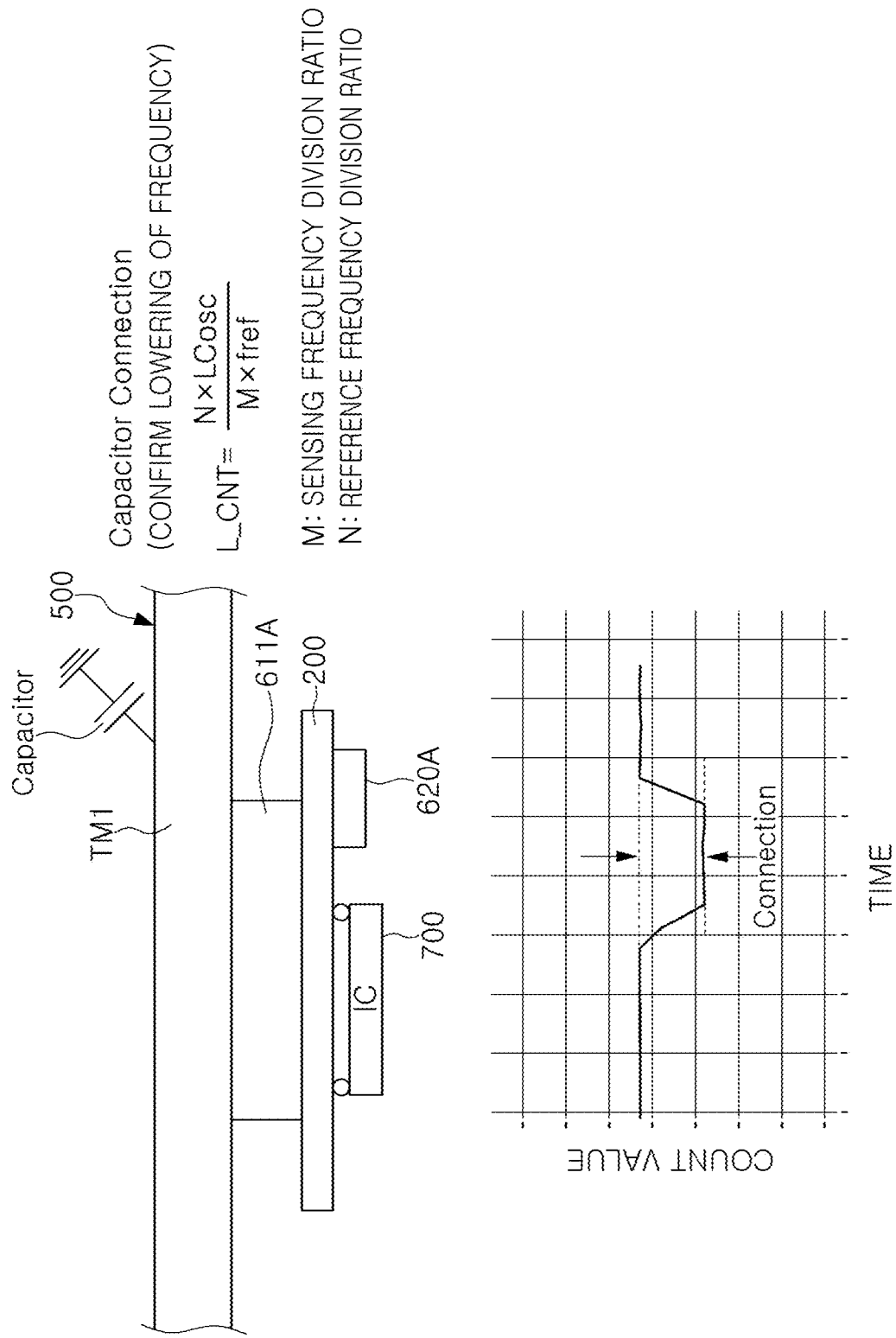
FIG. 27 illustrates an example of a count value when a capacitor is connected between a touch member and a ground.

FIG. 25 illustrates an example of a count value when a touch member is touched by a finger, FIG. 26 illustrates an example of a count value when a touch member is touched by a metal object, and FIG. 27 illustrates an example of a count value when a capacitor is connected between a touch member and a ground.

Referring to FIGS. 25, 26, and 27, the digital frequency counter (710 in FIGS. 9 and 12) converts a frequency of a resonance signal into a digital value to output a count value L_CNT corresponding to a resonant frequency. As an example, the count value L_CNT may be obtained according to Equation 4 below.

$$L\_CNT = (N * L\text{Cosc})/(M * \text{fref}) \qquad (4)$$

In Equation 4, LCosc denotes a resonance signal (or a resonant frequency), fref denotes a reference frequency (for example, 32 kHz), N denotes a reference frequency division ratio, and M denotes a sensing frequency division ratio.

In Equation 4, the dividing of the resonance signal LCosc by the reference frequency fref corresponds to counting the resonance signal LCosc during one period of the reference frequency fref. When the count value L_CNT is obtained in such a manner, a low reference frequency fref may be used and a precision of the count may be improved.

Referring to FIG. 25, it can be seen that a count value corresponding to a resonant frequency is reduced when the first touch member TM1 is touched by a finger. Referring to FIG. 26, it can be seen that a count value corresponding to a resonant frequency is reduced when the first touch member TM1 is touched by a metal object. Referring to FIG. 27, it can be seen that a count value corresponding to a resonant frequency is reduced when a capacitor is connected between the first touch member TM1 and a ground.

Referring to FIGS. 25, 26, and 27, a touch input sensing apparatus may detect all of the finger touch, the metal touch, and the capacitor connection.

The touch input sensing apparatus may be applied to electric devices such as electrical products, electronic products, home appliances, communications devices, vehicles or vehicle-related devices, wireless control devices (for example, a remote controller or a smart key of a vehicle), mobile devices, wearable devices, or other electric devices, as well as any devices in which a button switch can be replaced with a touch switch. Examples of electric devices to which the touch input sensing apparatus may be applied will be described with reference to FIG. 28.

Figure 28:
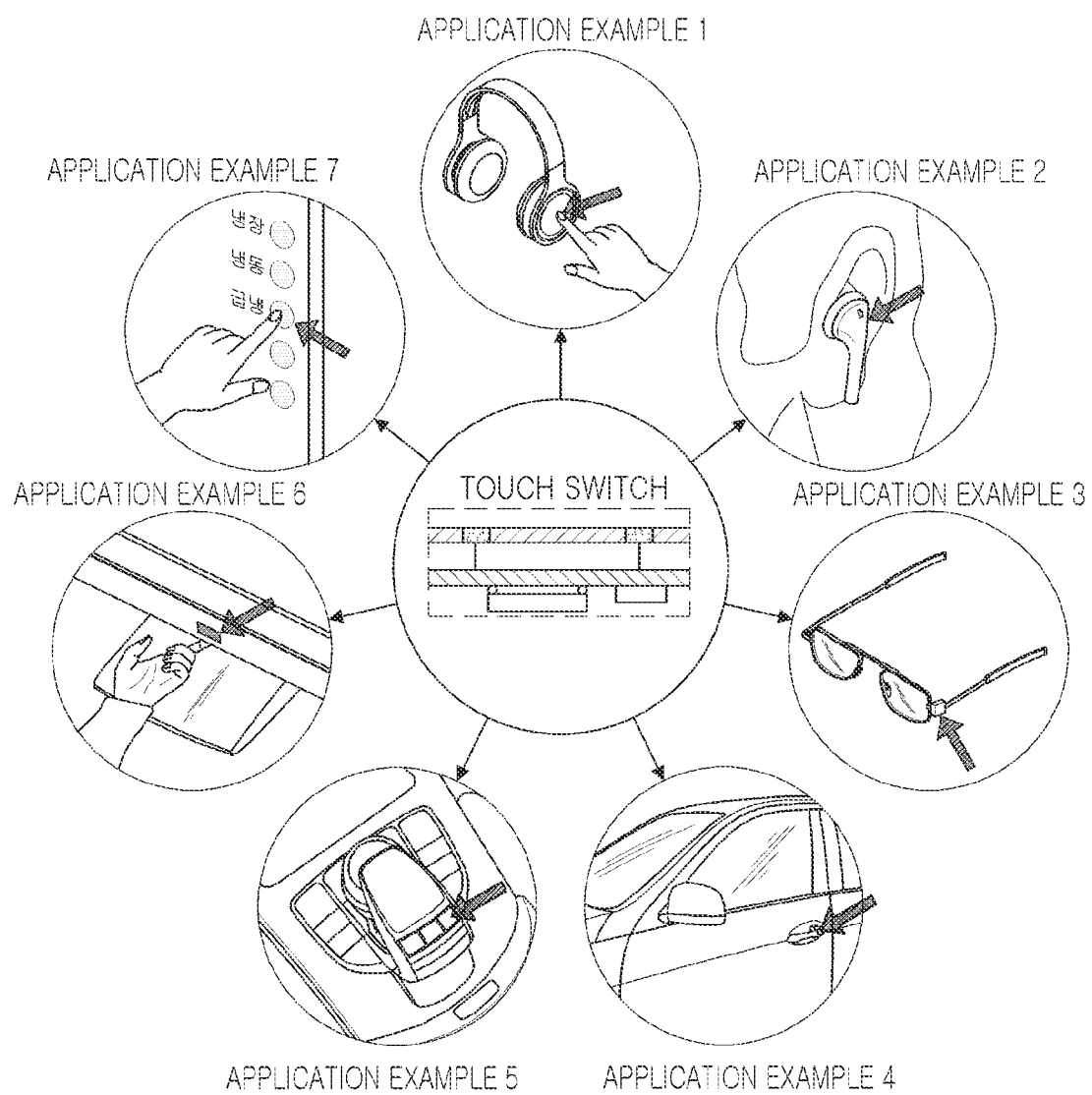
FIG. 28 illustrates examples of various applications of a touch input sensing apparatus of this application.

FIG. 28 illustrates examples of various applications of a touch input sensing apparatus.

Referring to FIG. 28, Application Examples 1 to 7 of a touch input sensing apparatus are illustrated.

Application Example 1 of FIG. 28 is an example in which an operation control button of Bluetooth headphones is replaced with a touch input sensing apparatus, and Application Example 2 of FIG. 28 is an example in which an operation control button of a Bluetooth earbud is replaced with a touch sensing apparatus. As an example, Application Examples 1 and 2 may be examples in which on/off power switches of Bluetooth headphones and a Bluetooth earbud have been replaced with touch input sensing apparatuses.

Application Example 3 of FIG. 28 is an example in which replace an operation control button of smart glasses is replaced with a touch input sensing apparatus. As an example, Application Example 3 may be an example in which a button for performing functions such as a phone function and a mail function, a home button, and other buttons of a device such as Google Glasses, a virtual reality (VR) device, or an augmented reality (AR) device are replaced with a touch input sensing apparatus.

Application Example 4 of FIG. 28 is an example in which a door lock button of a vehicles is replaced with a touch input sensing apparatus. Application Example 5 of FIG. 28 is an example in which a button of a smart key of a vehicle is replaced with a touch input sensing apparatus. Application Example 6 of FIG. 28 is an example in which an operation control button of a computer is replaced by a touch sensing apparatus. Application Example 7 of FIG. 28 is an example in which an operation control button of a refrigerator is replaced with a touch input sensing apparatus.

In addition, volume and power switches of a laptop computer, a switch of a VR device, a head-mounted display (HMD), a Bluetooth earphone, a stylus touch pen, or the like, and may be applied to replace buttons of a monitor of a home appliance, a refrigerator, a laptop computer, or the like.

For example, a touch input sensing apparatus replacing an operation control button of a device may be integrated with a cover, a frame, or a housing of the applied device, and may be used to turn power on and off, control a volume, and perform other specific functions (back, movement to home, locking, and the like).

In addition, a plurality of touch switches may be provided to perform a plurality of functions when corresponding functions (back, movement to home, locking, and the like) are performed.

As described above, a unique touch switch structure, integrated with a housing of an electric device such as a mobile device, and a unique signal processing method are used to replace a mechanical button switch. Thus, a touch input of the housing may be precisely sensed.

In addition, a thinner, simpler, and tidier design may be implemented, and a complex and high-cost signal processor such as an additional analog-to-digital converter (ADC) is not required. When a coil element is directly attached to a touch member integrated with a housing of an electric device such as a mobile device or other electric device, an additional spacer structure is not required. Thus, the electric device may be easily implemented. Since the touch member integrated with the housing is used as a touch area, a switch having dustproof and waterproof functions may be implemented and sensing may be performed even in a humid environment.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch input sensing device configured to be added to an electronic device, the electronic device comprising a touch input unit, the touch input unit comprising a first touch member integrated with a housing, the touch input sensing device comprising:
    a substrate on which the housing is disposed;
    a resonant circuit disposed on the substrate such that a first portion of the resonant circuit is disposed between the first touch member and the substrate on a first surface of the substrate and a second portion of the resonant circuit is disposed on a second surface of the substrate opposite the first surface, the resonant circuit being configured to generate a resonance signal having a resonant frequency that varies based on a touch of the touch input unit;
    a digital frequency counter configured to generate a count value by counting the resonance signal, which is input to the digital frequency counter as a sample clock signal, based on a reference frequency signal, which is input to the digital frequency counter as a reference clock signal; and
    a touch detection circuit configured to detect whether the touch of the touch input unit has occurred based on the count value generated by the digital frequency counter, and generate a touch detection signal indicating whether the touch has occurred.

2. The touch input sensing apparatus of claim 1, wherein the resonant circuit comprises:
    an inductance circuit having an inductance and comprising a first coil element disposed on an inner surface of the first touch member, or spaced apart from the inner surface of the first touch member; and
    a capacitance circuit having a capacitance and comprising a capacitance element connected to the inductance circuit,
    wherein the capacitance circuit is configured so that the capacitance of the capacitance circuit increases based on the touch of the touch input unit.

3. The touch input sensing apparatus of claim 2, wherein the first coil element is mounted on the substrate and is disposed on the inner surface of the first touch member.

4. The touch input sensing apparatus of claim 2, wherein the first coil element is mounted on the substrate and is spaced apart from the inner surface of the first touch member.

5. The touch input sensing apparatus of claim 2, wherein the digital frequency counter is further configured to divide the reference frequency signal by a reference frequency division ratio to generate a divided reference clock signal, and count the resonance signal based on the divided reference clock signal to generate the count value.

6. The touch input sensing apparatus of claim 2, wherein the digital frequency counter is further configured to divide the reference frequency signal by a reference frequency division ratio to generate a divided reference clock signal, divide the resonance signal by a sensing frequency division ratio to generate a divided resonance signal, and count the divided resonance signal based on the divided reference clock signal to generate the count value.

7. The touch input sensing apparatus of claim 2, wherein the digital frequency counter comprises:
    a frequency down-converter configured to receive the reference frequency signal as a reference clock signal, and divide the reference clock signal by a reference frequency division ratio to generate a divided reference clock signal;
    a periodic timer configured to receive the resonance signal as a sample clock signal, receive the divided reference clock signal, and count the sample clock signal during one time period of the divided reference clock signal to generate a periodic count value; and
    a cascaded integrator-comb (CIC) filter circuit configured to receive the periodic count value, and cumulatively amplify the periodic count value to generate the count value.

8. The touch input sensing apparatus of claim 7, wherein the CIC filter circuit comprises:
    a decimator CIC filter configured to receive the periodic count value, and cumulatively amplify the periodic count value to generate a cumulatively amplified periodic count value; and
    a first-order CIC filter configured to receive the cumulatively amplified periodic count value, and calculate a moving average of the cumulatively amplified periodic count value to remove noise from the cumulatively amplified periodic count value and generate the count value.

9. The touch input sensing apparatus of claim 8, wherein the decimator CIC filter is further configured to cumulatively amplify the periodic count value by a cumulative gain determined based on an integrating stage number, a decimator factor, and a comb differential delay of the decimator CIC filter to generate the cumulatively amplified periodic count value.

10. The touch input sensing apparatus of claim 2, wherein the touch detector is further configured to receive the count value, differentiate the count value to generate a difference value, compare the difference value with a comparison value, and generate, as the touch detection signal, a signal having a level indicating whether the touch has occurred based on a result of the comparing.

11. The touch input sensing apparatus of claim 2, wherein the touch detector comprises:
a delay part configured to receive the count value and a delay control signal, and delay the count value by a delay time determined by the delay control signal to generate a delayed count value;
a subtraction part configured to receive the count value and the delayed count value, and subtract the count value from the delayed count value, or subtract the delayed count value from the count value, to generate a difference value; and
a comparison part configured to receive the difference value, compare the difference value with a comparison value, and generate, as the touch detection signal, a signal having a high level or a low level determined based on a result of the comparing.

12. The touch input sensing apparatus of claim 11, wherein the comparison part is further configured to:
compare the difference value with an upper limit comparison value to determine whether to switch the touch detection signal from the low level to the high level, where the upper limit comparison value is equal to a first fraction of a maximum value of the difference value, and
compare the difference value with a lower limit comparison value to determine whether to switch the touch detection signal from the high level to the low level, where the lower limit comparison value is equal to a second fraction of the maximum value of the difference value, and is less than the upper limit comparison value.

13. The touch input sensing apparatus of claim 2, wherein the digital frequency counter comprises:
a frequency down-converter configured to receive the resonance signal as a reference clock signal, and divide the reference clock signal by a reference frequency division ratio to generate a divided reference clock signal;
a periodic timer configured to receive the reference frequency signal as a sample clock signal, receive the divided reference clock signal, and count the sample clock signal during one time period of the divided reference clock signal to generate a periodic count value; and
a cascaded integrator-comb (CIC) filter circuit configured to receive the periodic count value, and cumulatively amplify the periodic count value to generate the count value.

14. An electronic device comprising:
a substrate;
a housing disposed on the substrate;
a touch input unit comprising a first touch member integrated with the housing;
a resonant circuit disposed on the substrate such that a first portion of the resonant circuit is disposed between the first touch member and the substrate on a first surface of the substrate and a second portion of the resonant circuit is disposed on a second surface of the substrate opposite the first surface, the resonant circuit being configured to generate a resonance signal having a resonant frequency that varies based on a touch of the touch input unit;
a digital frequency counter configured to generate a count value by counting the resonance signal, which is input to the digital frequency counter as a sample clock signal, based on a reference frequency signal, which is input to the digital frequency counter as a reference clock signal; and
a touch detection circuit configured to detect whether the touch of the touch input unit has occurred based on the count value generated by the digital frequency counter, and output a touch detection signal indicating whether the touch has occurred.

15. The electronic device of claim 14, wherein the housing comprises a specific material, and the first touch member comprises the specific material.

16. The electronic device of claim 15, wherein the touch input unit further comprises a second touch member integrated with the housing and disposed at a position different from a position of the first touch member, and
the second touch member comprises the specific material.

17. The electronic device of claim 14, wherein the touch input unit further comprises:
a second touch member integrated with the housing and disposed at a position different from a position of the first touch member; and
an insulating member disposed between the first touch member and the second touch member, between the first touch member and the housing, and between the second touch member and the housing.

18. The electronic device of claim 14, wherein the touch input unit further comprises a second touch member integrated with the housing and disposed at a position different from a position of the first touch member,
the first touch member comprises a first metal member, and a first insulating member covering a portion of the first metal member,
the second touch member comprises a second metal member, and a second insulating member covering a portion of the second metal member, and
the first metal member is electrically insulated from the second metal member by the first insulating member and the second insulating member.

19. The electronic device of claim 14, wherein the touch input unit further comprises a second touch member integrated with the housing and disposed at a position different from a position of the first touch member,
the first touch member comprises a first insulating member, and
the second touch member comprises a second insulating member separated from the first insulating member by the housing.

20. The electronic device of claim 19, wherein the first touch member further comprises a first metal member integrated with the housing and covering a portion of the first insulating member.

21. The electronic device of claim 14, wherein the housing comprises a material,
the first touch member further comprises a first insulating member, and a first metal member integrated with the housing and covering the first insulating member, where the first insulating member comprises a material different from the material of the housing, and the touch input unit further comprises:
- a second touch member comprising a second insulating member, and a second metal member integrated with the housing and covering the second insulating member, where the second insulating member comprises a material different from the material of the housing; and
- an isolation member electrically isolating the first touch member and the second touch member from each other.

22. The electronic device of claim 14, wherein the resonant circuit comprises:
- an inductance circuit having an inductance and comprising a first coil element disposed on an inner surface of the first touch member, or spaced apart from the inner surface of the first touch member; and
- a capacitance circuit having a capacitance and comprising a capacitance element connected to the inductance circuit,
- wherein the capacitance circuit is configured so that the capacitance of the capacitance circuit increases based on the touch of the touch input unit.

23. The electronic device of claim 22, wherein the first coil element is mounted on the substrate and is disposed on the inner surface of the first touch member.

24. The electronic device of claim 22, wherein the first coil element is mounted on the substrate and is spaced apart from the inner surface of the first touch member.

25. The electronic device of claim 22, wherein the digital frequency counter is further configured to divide the reference frequency signal by a reference frequency division ratio to generate a divided reference clock signal, and count the resonance signal based on the divided reference clock signal to generate the count value.

26. The electronic device of claim 22, wherein the digital frequency counter is further configured to divide the reference frequency signal by a reference frequency division ratio to generate a divided reference clock signal, divide the resonance signal by a sensing frequency division ratio to generate a divided resonance signal, and count the divided resonance signal based on the divided reference clock signal to generate the count value.

27. The electronic device of claim 22, wherein the digital frequency counter comprises:
- a frequency down-converter configured to receive the reference frequency signal as a reference clock signal, and divide the reference clock signal by a reference frequency division ratio to generate a divided reference clock signal;
- a periodic timer configured to receive the resonance signal as a sample clock signal, receive the divided reference clock signal, and count the sample clock signal during one time period of the divided reference clock signal to generate a periodic count value; and
- a cascaded integrator-comb (CIC) filter circuit configured to receive the periodic count value, and cumulatively amplify the periodic count value to generate the count value.

28. The electronic device of claim 27, wherein the CIC filter circuit comprises:
- a decimator CIC filter configured to receive the periodic count value, and cumulatively amplify the periodic count value to generate a cumulatively amplified periodic count value; and
- a first-order CIC filter configured to receive the cumulatively amplified periodic count value, and calculate a moving average of the cumulatively amplified periodic count value to remove noise from the cumulatively amplified periodic count value and generate the count value.

29. The electronic device of claim 28, wherein the decimator CIC filter is further configured to cumulatively amplify the periodic count value by a cumulative gain determined based on an integrating stage number, a decimator factor, and a comb differential delay of the decimator CIC filter to generate the cumulatively amplified periodic count value.

30. The electronic device of claim 22, wherein the touch detector is further configured to receive the count value, differentiate the count value to generate a difference value, compare the difference value with a comparison value, and generate, as the touch detection signal, a signal having a level indicating whether the touch has occurred based on a result of the comparing.

31. The electronic device of claim 22, wherein the touch detector comprises:
- a delay part configured to receive the count value and a delay control signal, and delay the count value by a delay time determined by the delay control signal to generate a delayed count value;
- a subtraction part configured to receive the count value and the delayed count value, and subtract the count value from the delayed count value, or subtract the delayed count value from the count value, to generate a difference value; and
- a comparison part configured to receive the difference value, compare the difference value with a comparison value, and generate, as the touch detection signal, a signal having a high level or a low level determined based on a result of the comparing.

32. The electronic device of claim 31, wherein the comparison part is further configured to:
- compare the difference value with an upper limit comparison value to determine whether to switch the touch detection signal from the low level to the high level, where the upper limit comparison value is equal to a first fraction of a maximum value of the difference value, and
- compare the difference value with a lower limit comparison value to determine whether to switch the touch detection signal from the high level to the low level, where the lower limit comparison value is equal to a second fraction of the maximum value of the difference value, and is less than the upper limit comparison value.

33. The electronic device of claim 22, wherein the digital frequency counter comprises:
- a frequency down-converter configured to receive the resonance signal as a reference clock signal, and divide the reference clock signal by a reference frequency division ratio to generate a divided reference clock signal;
- a periodic timer configured to receive the reference frequency signal as a sample clock signal, receive the divided reference clock signal, and count the sample clock signal during one time period of the divided reference clock signal to generate a periodic count value; and
- a cascaded integrator-comb (CIC) filter circuit configured to receive the periodic count value, and cumulatively amplify the periodic count value to generate the count value.

* * * * *